United States Patent
Everage et al.

(10) Patent No.: US 6,529,531 B1
(45) Date of Patent: Mar. 4, 2003

(54) FAST WAVELENGTH CORRECTION TECHNIQUE FOR A LASER

(75) Inventors: George J. Everage, Escondido, CA (US); Igor V. Fomenkov, San Diego, CA (US); Palash P. Das, Vista, CA (US); Richard L. Sandstrom, Encinitas, CA (US); Frederick G. Erie, Encinitas, CA (US); John M. Algots, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 243 days.

(21) Appl. No.: 09/597,812

(22) Filed: Jun. 19, 2000

Related U.S. Application Data

(63) Continuation-in-part of application No. 08/898,630, filed on Jul. 22, 1997, now Pat. No. 6,078,599, and a continuation-in-part of application No. 09/501,160, filed on Feb. 9, 2000.

(51) Int. Cl.[7] .............................. H01S 3/10; H01S 3/13; H01S 3/00; H01S 3/22; H01S 3/223
(52) U.S. Cl. ................. 372/20; 372/29.011; 372/38.01; 372/57
(58) Field of Search .................... 372/20, 29.011, 372/57–59, 102, 38.01

(56) References Cited

U.S. PATENT DOCUMENTS

| | | | |
|---|---|---|---|
| 4,697,270 A | 9/1987 | Galkowski | 372/34 |
| 4,798,467 A | 1/1989 | Wyeth et al. | 356/349 |
| 4,817,101 A | 3/1989 | Wyeth et al. | 372/32 |
| 4,940,331 A | 7/1990 | Wyeth et al. | 356/349 |
| 5,025,445 A | 6/1991 | Anderson et al. | 372/20 |
| 5,095,492 A | 3/1992 | Sandstrom | 372/102 |
| 5,128,601 A | 7/1992 | Orbach et al. | 372/30 |
| 5,371,587 A | 12/1994 | de Groot et al. | 356/349 |
| 5,420,877 A | 5/1995 | Sandstrom | 372/34 |
| 5,450,207 A | 9/1995 | Fomenkov | 356/416 |
| 5,524,144 A | 6/1996 | Suzuki | 359/176 |
| 5,608,561 A | * 3/1997 | Marcuse et al. | 359/161 |
| 5,691,989 A | 11/1997 | Rakuljic | 372/20 |
| 5,706,301 A | 1/1998 | Lagerström | 372/32 |
| 5,754,571 A | 5/1998 | Endoh et al. | 372/20 |
| 5,835,520 A | * 11/1998 | Das et al. | 372/57 |
| 5,852,621 A | 12/1998 | Sandstrom | 372/25 |
| 5,856,991 A | * 1/1999 | Ershob | 372/57 |
| 5,870,420 A | 2/1999 | Webb | 372/58 |
| 5,978,405 A | 11/1999 | Juhasz et al. | 372/57 |
| 5,991,324 A | 11/1999 | Knowles et al. | 372/57 |
| 6,005,879 A | 12/1999 | Sandstrom et al. | 372/25 |
| 6,128,323 A | 10/2000 | Myers et al. | 372/38 |
| 6,243,405 B1 | * 6/2001 | Borneis et al. | 372/57 |
| 6,330,253 B1 | * 12/2001 | Tuganov et al. | 372/9 |

OTHER PUBLICATIONS

Ishihara, T., et al., "Advanced Krypton Fluoride Excimer Laser for Microlithography," *SPIE* vol 1674, Optical/Laser Microlithography V (1992) pp. 473–485.

* cited by examiner

*Primary Examiner*—Paul Ip
*Assistant Examiner*—Davienne Monbleau
(74) *Attorney, Agent, or Firm*—John R. Ross

(57) ABSTRACT

Electric discharge laser with fast chirp correction. Fast wavelength chirp correction equipment includes at least one piezoelectric drive and a fast wavelength detection means and has a feedback response time of less than 1.0 millisecond. In a preferred embodiment a simple learning algorithm is described to allow advance tuning mirror adjustment in anticipation of the learned chirp pattern. Techniques include a combination of a relatively slow stepper motor and a very fast piezoelectric driver. In another preferred embodiment chirp correction is made on a pulse-to-pulse basis where the wavelength of one pulse is measured and the wavelength of the next pulse is corrected based on the measurement. This correction technique is able to function at repetition rates as rapid as 2000 Hz and greater.

12 Claims, 24 Drawing Sheets

FAST WAVELENGTH CORRECTION TECHNIQUE FOR A LASER

This application is a continuation-in-part of Ser. No. 08/898,630 filed Jul. 22, 1997 soon to issue as U.S. Pat. No. 6,078,599 and Ser. No. 09/501,160 filed Feb. 9, 2000.

FIELD OF THE INVENTION

This invention relates to lasers and, in particular, to correcting wavelength shift in lasers.

BACKGROUND OF THE INVENTION

Lasers are used for many applications. In one example, lasers are used in steppers for selectively exposing photoresist in a semiconductor wafer fabrication process. In such fabrication processes, the optics in the stepper are designed for a particular wavelength of the laser. The laser wavelength may drift over time and, thus, a feedback network is typically employed to detect the wavelength of the laser and correct the wavelength as necessary.

In one type of feedback network used to detect and adjust the wavelength of a laser, an etalon receives a portion of the emitted light from the laser. The etalon creates an interference pattern having concentric bands of dark and light levels due to destructive and constructive interference by the laser light. The concentric bands surround a center bright portion. The position of the bright center portion of the interference pattern is used to determine wavelength to a relatively coarse degree, such as to within 5 picometers (pm). The diameter of a light band is used to determine the wavelength of the laser to a fine degree, such as to within 0.01–0.03 pm. The width of a light band is used to determine the spectral width of the laser output. The interference pattern is usually referred to as a fringe pattern. The fringe pattern may be optically detected by a sensitive photodetector array.

Various methods are well known for wavelength tuning of lasers. Typically the tuning takes place in a device referred to as a line narrowing package or line narrowing module. A typical technique used for line narrowing and tuning of excimer lasers is to provide a window at the back of the discharge cavity through which a portion of the laser beam passes into the line narrowing package. There, the portion of the beam is expanded and directed to a grating which reflects a narrow selected portion of the laser's broader spectrum back into the discharge chamber where it is amplified. The laser is typically tuned by changing the angle at which the beam illuminates the grating. This may be done by adjusting the position of the grating or providing a mirror adjustment in the beam path. The adjustment of the grating position or the mirror position may be made by a mechanism which we will refer to as a laser wavelength adjustment mechanism.

FIG. 1 is a graph 10 which illustrates the wavelength drift over a burst of pulses from a laser. In particular, FIG. 1 indicates wavelength shift (i.e., wavelength drift from a desired wavelength output) of a maximum magnitude greater than about 0.1 pm. The circled section 12 of graph 10 indicates a large wavelength shift referred to as a wavelength chirp from the laser. As shown in FIG. 1, after the wavelength chirp, the wavelength output settles down to a wavelength shift of a maximum magnitude of less than about 0.05 pm. Conventional wavelength correction techniques do not adequately correct the large and sudden wavelength shifts in the wavelength chirp.

Excimer lasers operating in a burst mode also produce a pulse energy chirp similar to the wavelength chirp. Prior art methods have been disclosed to minimize the pulse energy chirp. One such method is described in an article by the inventors' co-workers, "Advanced Krypton Fluoride Excimer Laser for Microlithography, *SPIE* Vol. 1674, "Optical/Laser Microlithography V, (1992) 473–484, see page 480.

What is needed is a technique to correct the wavelength shift in the wavelength chirp of a laser.

SUMMARY OF THE INVENTION

The present invention provides an electric discharge laser with fast chirp correction. Fast wavelength chirp correction equipment includes at least one piezoelectric drive and a fast wavelength detection means and has a feedback response time of less than 1.0 millisecond. In a preferred embodiment a simple learning algorithm is described to allow advance tuning mirror adjustment in anticipation of the learned chirp pattern. Techniques include a combination of a relatively slow stepper motor and a very fast piezoelectric driver. In another preferred embodiment chirp correction is made on a pulse-to-pulse basis where the wavelength of one pulse is measured and the wavelength of the next pulse is corrected based on the measurement. This correction technique is able to function at repetition rates as rapid as 2000 Hz and greater.

DETAILED DESCRIPTION OF PREFERRED EMBODIMENTS

Wavelength Chirp

FIGS. 2A, 2B, 2C and 2D are graphs 16, 18, 20 and 22, respectively, which illustrate the wavelength drift over four sequential bursts of pulses from a laser. Graphs 16, 18, 20 and 22 reveal that the shape or pattern of the wavelength drift of the wavelength chirp from a particular laser is similar from burst-to-burst. Data averaged over 60 pulses is shown as the solid lines in graphs 16, 18, 20 and 22.

Chirp Correction with Stepper Motor

Figure 1:
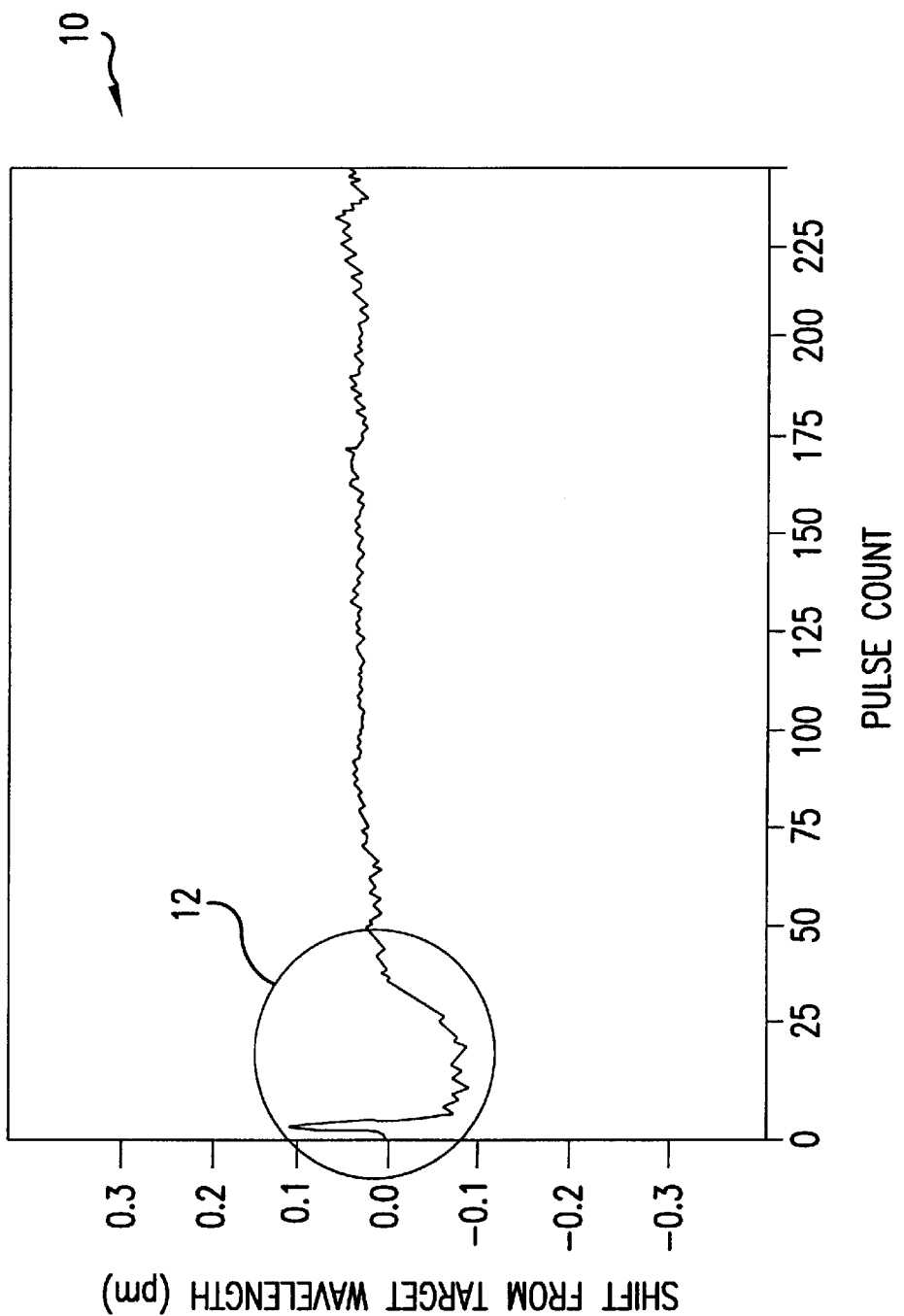
FIG. 1 is a graph of measurements of wavelength drift over a burst of pulses from a laser.
Figure 2A:
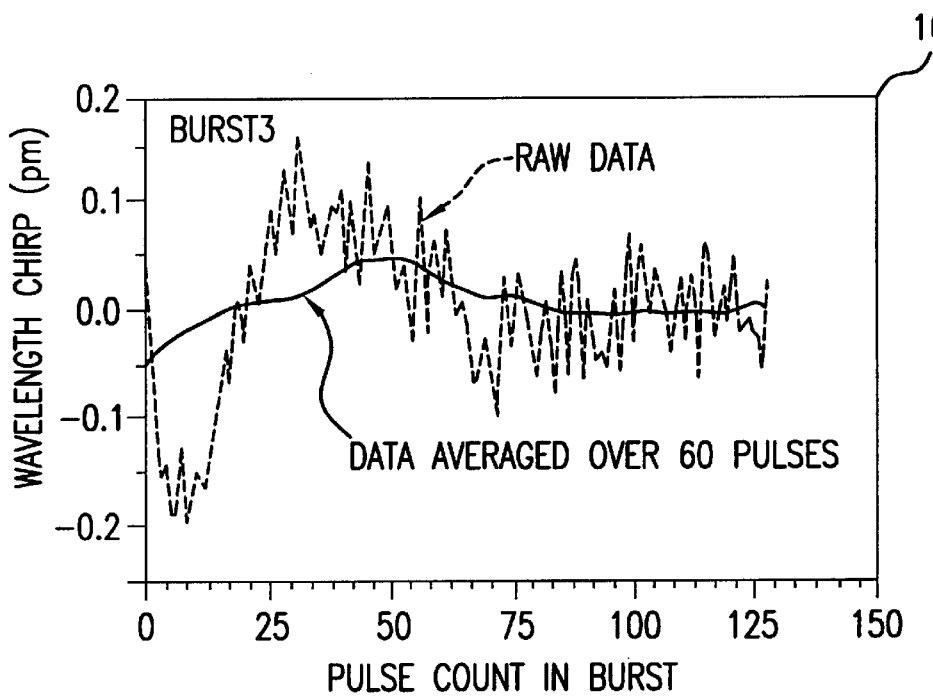
FIGS. 2A–D are graphs of measurements of wavelength drift over four sequential bursts of pulses from a laser.
Figure 2B:
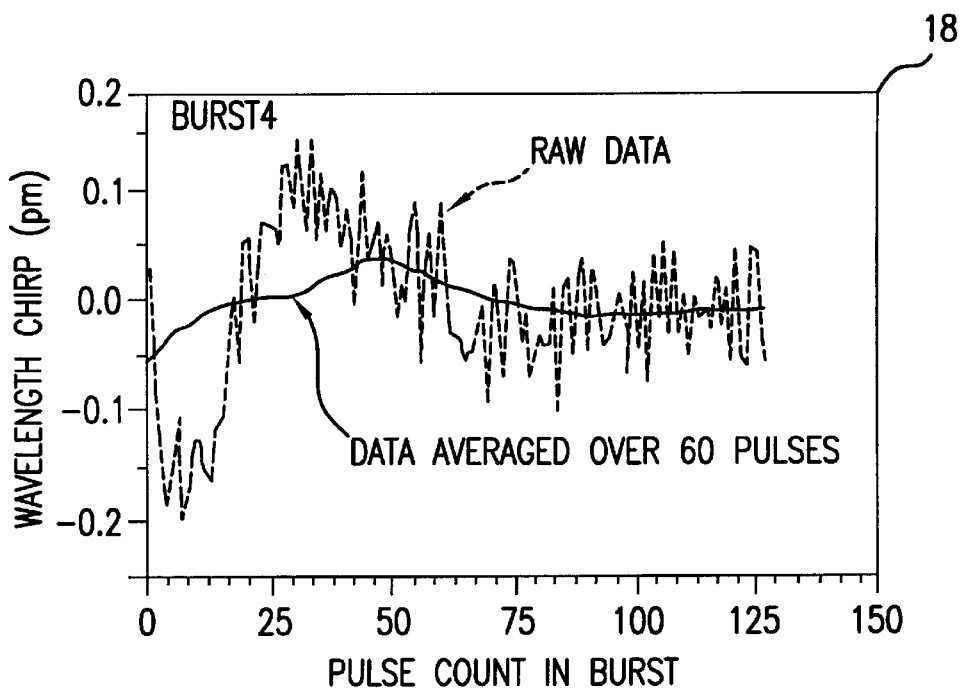
Figure 2C:
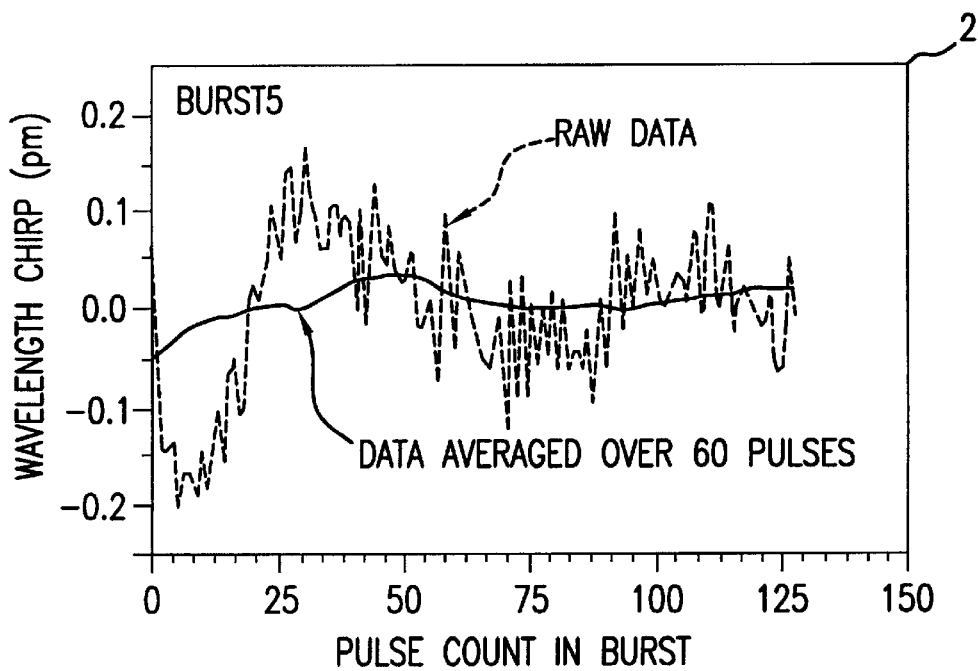
Figure 2D:
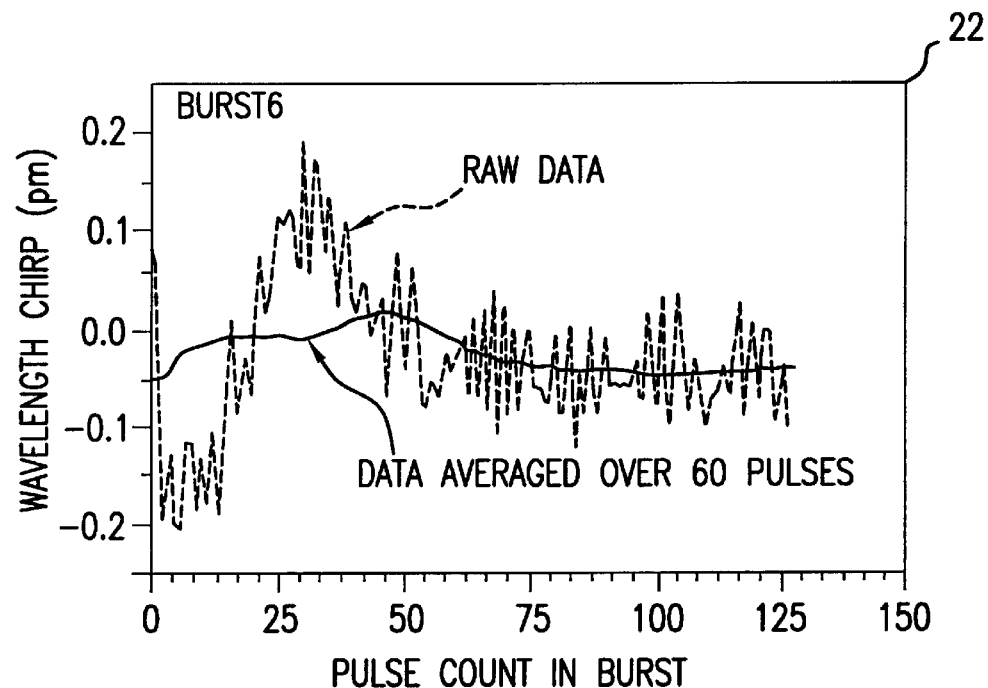
Figure 3:
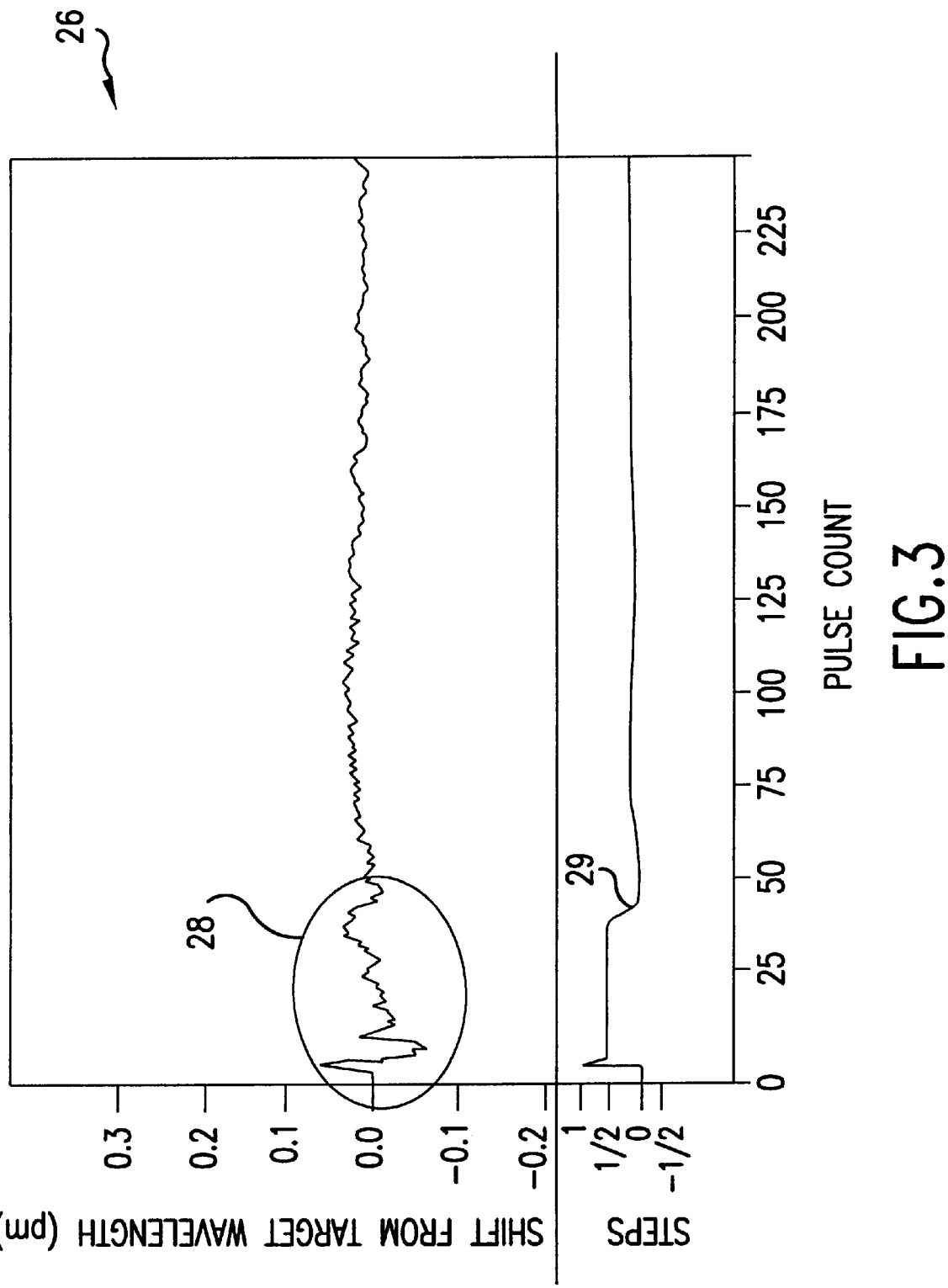
FIG. 3 is a graph of measurements of wavelength drift over a burst of pulses from a laser that has its wavelength output corrected in accordance with one embodiment of the present invention.

The graph 26 of FIG. 3 illustrates the wavelength shift over a burst of pulses from a laser that has its wavelength output corrected using a stepper motor. A circled section 28 of graph 26 reveals a significant reduction in the magnitude of wavelength drift during the wavelength chirp period of the laser, relative to the circled section 12 of graph 10 of FIG. 1. In particular, the magnitude of the maximum wavelength shift during the wavelength chirp period shown in graph 26 is about 0.05 pm.

Stepper motor control line 29 indicates that a stepper motor, which controls optical grating positions for tuning the laser, takes a full step up at the initiation of the burst, followed by a ½ step down at about pulse 4, followed by another ½ step down at about pulse 36. The step amounts and timing for the step adjustments, of course, varies for the particular system and varies for a particular burst.

Chirp Correction Equipment

Figure 4:
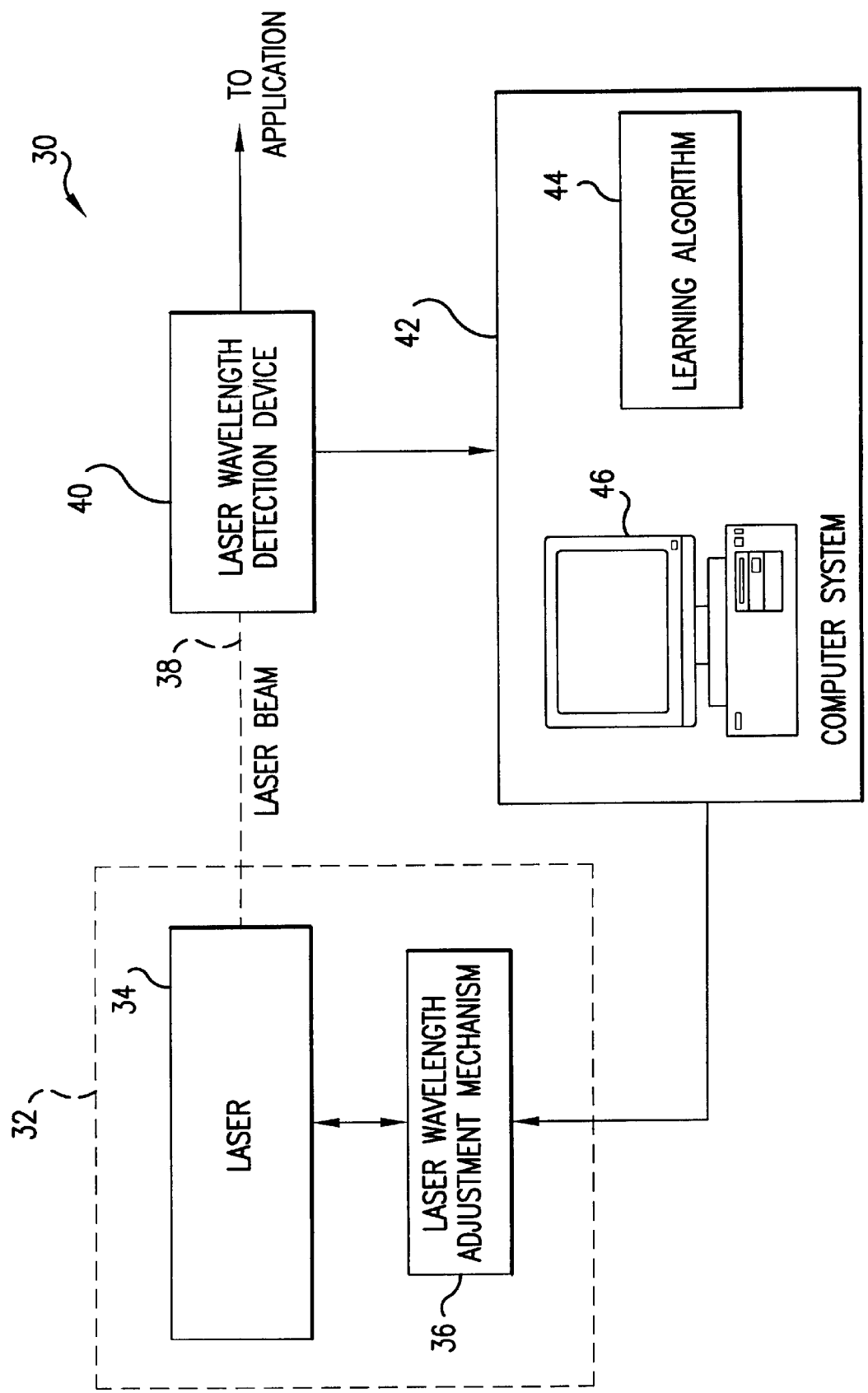
FIG. 4 illustrates the preferred embodiment of a wavelength shift correction system for a laser system.

FIG. 4 illustrates the preferred embodiment of a wavelength shift correction system 30 for a laser system 32. Laser system 32 includes a tunable laser 34. In one embodiment, laser 34 is an ultraviolet (UV) excimer laser which emits pulses of laser energy. Laser system 32 also includes a laser wavelength adjustment mechanism 36 to adjust the wavelength of laser 34. In one embodiment, laser wavelength adjustment mechanism 36 is capable of tuning laser 34 over a limited tunability range in a period of about 10–20 ms. Laser wavelength adjustment mechanism 36 may be any known laser wavelength adjustment mechanism. In the preferred embodiment, laser wavelength adjustment mechanism 36 includes a stepper motor or piezoelectric transducer controlling the angle at which a laser beam being tuned illuminates a grating located in a line narrowing module. The grating reflects a narrow range of wavelengths back into the laser excitation chamber for duplication. These wavelength adjustment mechanisms are well known in the art.

Laser Wavelength Detection

As laser 34 is being operated in an application, such as in a stepper for wafer fabrication, a portion of its emitted laser beam 38 is directed to a laser wavelength detection device 40. Laser wavelength detection device 40 may be a conventional device which detects the wavelength of laser beam 38. Further details regarding a suitable laser and optical elements for detecting and tuning the wavelength of laser light may be found in the following patents assigned to the present assignee and incorporated herein by reference: U.S. Pat. No. 5,025,445, entitled System For, and Method of, Regulating the Wavelength of a Light Beam, by Stuart Anderson et al.; U.S. Pat. No. 5,420,877, entitled Temperature Compensation Method and Apparatus for Wave Meters and Tunable Lasers Controlled Thereby, by Richard Sandstrom et al.; U.S. Pat. No. 5,095,492, entitled Spectral Narrowing Technique, by Richard Sandstrom; and U.S. Pat. No. 5,450,207, entitled Method and Apparatus for Calibrating a Laser Wavelength Control Mechanism, by Igor Fomenkov. The precise technique used to provide accurate wavelength detection is not relevant to this invention.

Laser wavelength detection device 40 accurately converts certain characteristics of laser beam 38 into digital signals for use by additional processing circuitry, such as a chirp acquisition system 42 described in detail below. The additional processing circuitry may use the digital signals to control the wavelength of tunable laser 34 and to determine various other characteristics of laser beam 38. Laser 34 may be tuned mechanically, optically, or chemically (e.g., by controlling the mixture of gases in laser 34), and the precise method used to tune the laser is not relevant to this invention.

In one embodiment, laser 34 emits pulses at 1000 pulses per second or greater. Ideally, laser wavelength detection device 40 detects the wavelength of each pulse in a burst of pulses from laser 34. Alternatively, laser wavelength detection device 40 may detect the wavelength of a sampled subset of pulses in the burst of pulses from laser 34.

Any technique used in the industry or described in any publication may be used in order to determine the wavelength of a pulse of laser beam 38 to an accuracy of, in one embodiment, 0.01–0.03 pm. Examples of various wavelength detection techniques and devices are described in the patents previously mentioned, incorporated herein by reference.

Learning Algorithm

Laser wavelength detection device 40 is connected to a chirp acquisition system 42. Chirp acquisition system 42 includes a learning algorithm 44 that learns characteristics of a wavelength chirp from laser 34. Because the wavelength chirp from laser 34 may change over time and repeated usage, in one embodiment, learning algorithm 44 is scalable over time to learn changing characteristics of the wavelength chirp from laser 34. One skilled in the art would recognize that learning algorithm 44 can be implemented in any computer programming language. As indicated in FIG. 4, a computer system 46 executes learning algorithm 44. Computer system 46 may be, for example, a single microprocessor, a hard-wired logic circuit, or a more complex system such as one or more personal computers. Computer system 46 may also perform conventional wavelength correction after the wavelength chirp period.

Based on the learned characteristics of the wavelength chirp from laser 34, chirp acquisition system 42 sends control signals that contain correction terms to laser wavelength adjustment mechanism 36 for suitably adjusting the wavelength output of laser 34. As a result, the magnitudes of the wavelength shift during the wavelength chirp in the present and subsequent bursts of pulses from laser 34 are reduced, in one embodiment, to a magnitude of maximum wavelength shift of less than about 0.05 pm.

Figure 5:
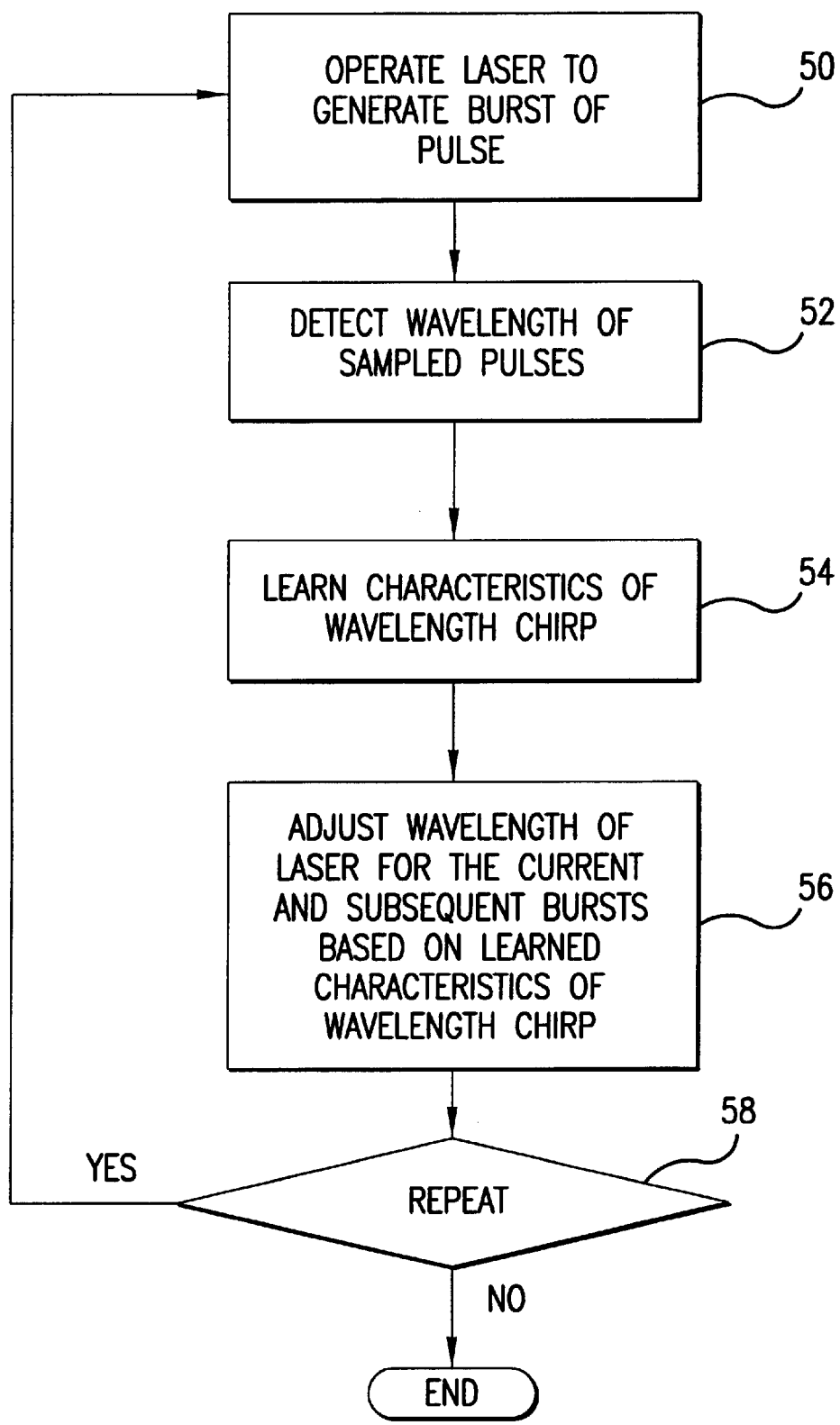
FIG. 5 is a flowchart of steps in accordance with one embodiment of the present invention.

FIG. 5 is a flowchart of steps in accordance with one embodiment of the present invention. In step 50, a laser is operated to generate a burst of pulses. In step 52, the wavelengths of sampled pulses are detected. The sampled pulses may constitute each pulse of the burst of pulses or a subset of pulses of the burst of pulses.

In step 54, characteristics of the wavelength chirp are learned. Step 54 will be described in greater detail with reference to FIG. 6.

Wavelength Correction

In step 56, the wavelength output of the laser is adjusted for the current and subsequent bursts based on the learned characteristics of the current wavelength chirp and previous (if any) wavelength chirps. Steps 50, 52, 54 and 56 may be repeated as indicated in step 58. Alternatively, steps 52, 54 and 56 may be performed only after a predetermined number of bursts of pulses or periodically.

Details of Learning Algorithm

Figure 6:
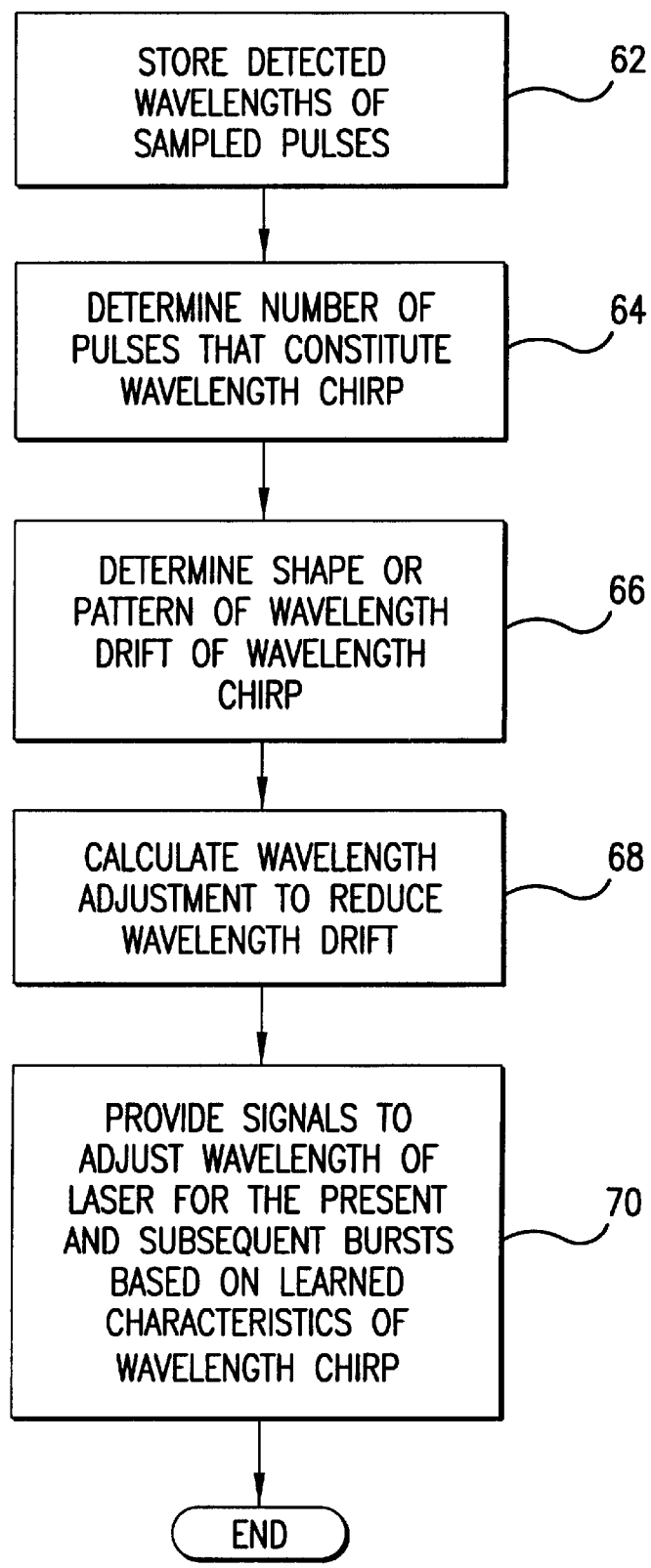
FIG. 6 is a flowchart that provides additional detail of the learning step of FIG. 4.

FIG. 6 is a flowchart that provides additional detail of learning step 54 and wavelength adjustment step 56 of FIG. 5. In step 62, the detected wavelengths of sampled pulses are stored. In step 64, the number of pulses that constitute the wavelength chirp are determined. The number of pulses that constitute the wavelength chirp period may be a predetermined number of pulses or dynamically determined according to when the wavelength shift settles down within a predetermined magnitude (e.g., less than about 0.05 pm).

In step 66, the wavelength shift of each sampled pulse is determined to learn the pattern or shape of the wavelength drift of the wavelength chirp. In step 68, the wavelength adjustment required to reduce or correct the wavelength drift for the present and subsequent wavelength chirps is calculated. In step 70, wavelength correction control signals are provided to dynamically adjust the wavelength output of the laser based on the learned characteristics of the wavelength chirp for the present burst and subsequent bursts. It is expected that the wavelength control signals during the wavelength chirp periods for a number of bursts will be significantly different from burst to burst for the first few bursts in a series of bursts and then be progressively similar after a number of bursts.

Accordingly, a technique for correcting wavelength shift in a tunable laser is described. Recognizing that the wavelength chirp from a particular laser is similar from burst-to-burst, characteristics of the wavelength chirp from the laser may be learned, and the learned characteristics may then be advantageously employed to reduce the magnitude of wavelength drift of the wavelength chirp in the present and subsequent bursts of pulses from the laser. By predicting the required wavelength shift during the wavelength chirp period, the wavelength correction system can act fast and make large wavelength shift changes which could not have been performed using conventional techniques.

Fast Wavelength Correction Using Piezoelectric Transducer

FIGS. 7 through 11, FIGS. 12A through 12D, FIGS. 13A and 13B and FIG. 16 describe techniques for very fast correction of the wavelength taking advantage of the extremely fast response of a piezoelectric transducer to pivot the tuning mirror.

Fast Wave Meter

In order to provide rapid control of wavelength such as at time intervals shorter than the time between pulses (0.5 ms for a 2000 Hz laser) it is desirable to be able to measure the wavelength faster than the time between pulses. Typical prior art lithography lasers require almost 2 ms to measure the wavelength. A description of a wavemeter and a technique for measuring wavelength is provided in U.S. Pat. No. 5,991,324 which is incorporated herein by reference. The following is a description of a similar wavemeter which has been modified to record the necessary data and perform the necessary calculation to determine wavelength at speeds of less than 420 microseconds.

Figure 16:
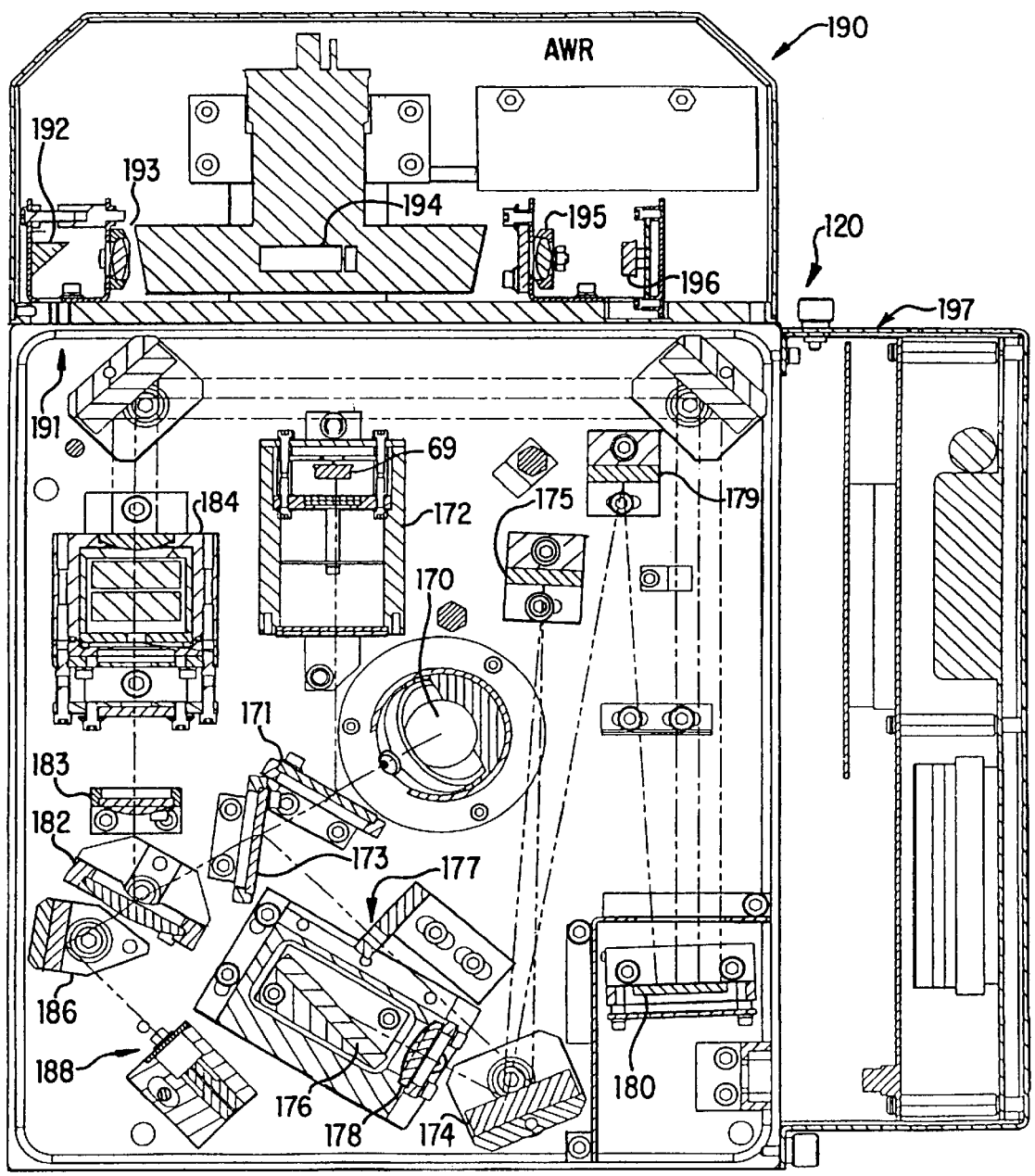
FIG. 16 is a drawing of a wavemeter.

As shown in FIG. 16, the output beam from the laser chamber intersects partially reflecting mirror 170, which passes about 95.5% of the beam energy and reflects about 4.5% into wavemeter 120.

About 4% of the reflected beam is reflected by mirror 171 to energy detector 172 which comprises a very fast photo cell 92 which is able to measure the energy of individual pulses occurring at the repetition rate of 4,000 pulses per second or greater. A typical pulse energy is about 10 mJ and the output of detector 69 is fed to computer controller 102 (FIG. 12) which uses a special algorithm (described in U.S. Pat. No. 6,005,879, incorporated herein by reference) to adjust the laser charging voltage to precisely control the pulse energy of future pulses based on stored pulse energy data in order to limit the variation of the energy of individual pulses and the integrated energy of bursts of pulses, all as described hereinafter.

About 4% of the beam which passes through mirror 171 is reflected by mirror 173 through slit 177 to mirror 174, to mirror 175, back to mirror 174 and onto eschelle grating 176. The beam is collimated by lens 178 having a focal length of 458.4 mm. Light reflected from grating 176 passes back through lens 178, is reflected again from mirrors 174, 175 and 174 again and then is reflected from mirror 179 and focused onto the left side of linear photo diode array 180. The position of the beam on the photo diode array is a coarse measure of the relative nominal wavelength of the output beam. About 90% of the beam which passes through mirror 173 is reflected off mirror 182 through lens 183 into etalon 184. The beam exiting etalon 184 is focused by a 458.4 mm focal length lens in the etalon and produces interference fringes on the middle and right side of linear photo diode array 180 after being reflected off two mirrors as shown in FIG. 16.

Linear Photo Diode Array

Linear photo diode array 180 is an integrated circuit chip comprising 1024 separate photo diode integrated circuits and an associated sample and hold readout circuit. The photo diodes are on a 25 micrometer pitch for a total length of 25.6 mm (about one inch). Each photo diode is 500 micrometer long. Photo diode arrays such as this are available from several sources. A preferred supplier is Hamamatsu. In one preferred embodiment, we use a Model S3903-1024 which can be read at the rate of $2.5 \times 10^6$ pixels/sec on a FIFO basis in which complete 1024 pixel scans can be read at rates greater than 2000 Hz. A faster array is Model RL 2048 PAQ supplied by EG&G Reticon with offices in Sunnyvale, Calif. This PDA can be read at 2,048 pixels at a 16.875 kilohertz frame rate.

Calculation of Coarse Wavelength

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$\lambda = (2.3 \text{ pm/pixel})P + 248{,}350 \text{ pm}$$

where

P=coarse image central positions

Fast Calculation of Fine Wavelength

The spectrometer must measure wavelength and bandwidth substantially in real time. Because the laser repetition rate may be 2 kHz or higher, it is necessary to use algorithms which are accurate but not computationally intensive in order to achieve the desired performance with economical and compact processing electronics. Preferably, Applicants use integer as opposed to floating point math, and operations are all linear (or use of square root, sine, log, etc.).

Figure 16A:
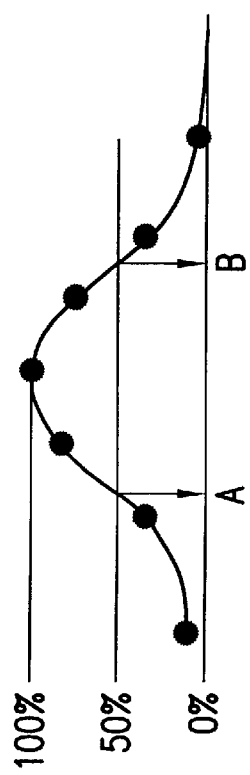
FIGS. 16A and 16B show how wavelength is calculated.
Figure 16B:
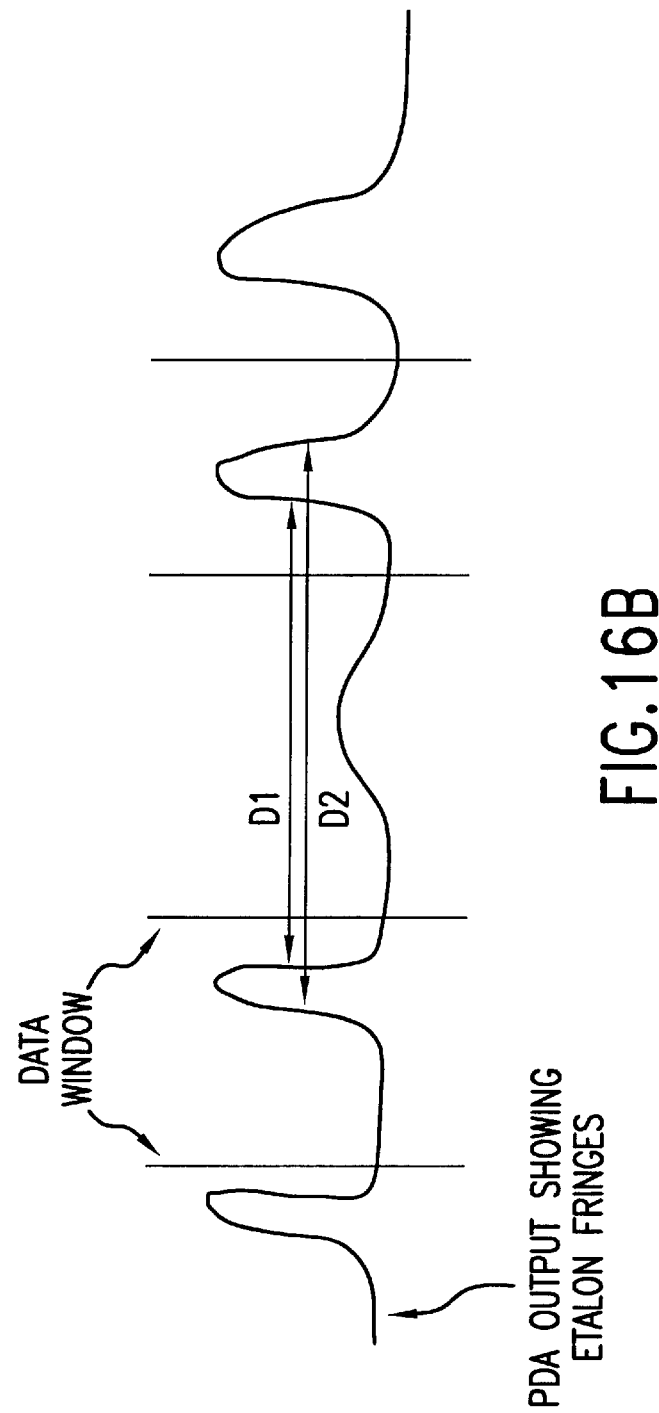

The specific details of a preferred algorithm used in this preferred embodiment will now be described. FIG. 16B is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks determines the wavelength, while their width measures the bandwidth of the laser. A region labeled "data window" is shown in FIG. 16B. The data window is located so that the fringe nearest the central peak is normally used for the analysis. However, when the wavelength changes to move the fringe too close to the central peak (which will cause distortion and resulting errors), the second closest peak will be inside the data window, and the software will jump to that peak. Conversely, when the wavelength shifts to move the current peak outside the data window away from the central peak the software will jump to an inner fringe within the data window.

The steps involved are as follows:

1. After a laser pulse, the photo diode array output is electronically read out and digitized. Data points are separated by an interval physically determined by the spacing of the photo diode array elements, in this case 25 micrometer pitch.
2. The digital data is searched to find the peak intensity value in the data window. The previous peak location is used as a starting point. Small regions are searched left and right of the starting point. The search region is extended by small intervals left and right until a peak is found. If the peak is outside the data window, the search will automatically continue until the other peak is found.
3. Based on the intensity of the peak, a 50% level is computed as shown in FIG. 16A. The 0% level is measured periodically between the pulses. Based on the computed 50% level, points are examined right and left of the peak until the data points which border the 50% level are found. A linear interpolation is computed between pairs of points, which border the 50% level to find the left and right half-maximum positions, labeled A, and B in FIG. 16A. These positions are computed to a fraction of a pixel such as 1/16, using an integer data format.
4. Steps 2 and 3 are duplicated for the two data windows, giving a total of four interpolated 50% positions. As indicated FIG. 16B, two diameters are computed. D1 is the inner fringe diameter while D2 is the outer fringe diameter.
5. An approximation to the wavelength is determined by the coarse wavelength circuit, as described in the preceding section "Calculation of Coarse Wavelength."

Fine Wavelength Calculation

The inner and outer fringe diameters D1 and D2 (in units of pixels) are each converted to wavelength by the following equations:

$$\lambda = \lambda_0 + Cd(D^2 - D_0^2) + N \cdot FSR$$

where $\lambda$=wavelength corresponding to diameter D $\lambda_0$=calibration wavelength $D_0$=diameter corresponding to wavelength $\lambda_0$ Cd=calibration constant dependant on the optical design FSR=free spectral range of the etalon N=integer,=0, ±1, ±2, ±3 . . .

The values $\lambda_0$, $K_1$, FSR, and $D_0$ are determined and stored at the time of calibration. The value for N is chosen such that:

$$|\lambda - \lambda_c| \leq \tfrac{1}{2} FSR$$

where $\lambda_c$=coarse wavelength determination.

For example, in a preferred embodiment, we select a reference wavelength $\lambda_0$=248,327.1 pm (corresponding to an absorption line of an iron hollow cathode lamp). At this wavelength, the fringe diameter $D_0$ might be found to be 300 pixels. Cd is a constant which can either be directly measured or calculated from the optical design. In our preferred embodiment, Cd=$-9.25 \times 10^{-5}$ pm/pixel$^2$. Thus, for example, with the laser operating at a different wavelength, the fringe diameter may be measured to be 405 pixels. The possible wavelengths computed by equation (1) are:

$$\lambda = 248{,}327.1 \text{ pm} - 9.25 \times 10^{-5} \text{ pm/pixel}^2 \, [(405)^2 - (300)^2] + N \cdot FSR$$
$$= 248{,}333.95 + N \cdot FSR$$

If the free spectral range FSR=20 pm, then the possible values for $\lambda$ include:

248,293.95 pm N=−2

248,313.95 pm N=−1

248,333.95 pm N=0

248,353.95 pm N=+1

248,373.95 pm N=+2

If the coarse wavelength is measured to be $\lambda_c$=248,350, for example, then the processor will select the value $\lambda$=248,353.95 pm (N=+1) as the solution in the closest agreement with $\lambda_c$.

The inner and outer fringe diameters $D_1$ and $D_2$ as shown in FIG. 16B are each converted into wavelengths $\lambda_1$ and $\lambda_2$, respectively. The final value which is reported for the laser wavelength is the average of these two calculations:

$$\lambda = \left(\frac{\lambda_1 + \lambda_2}{2}\right)$$

Bandwidth Calculation

The bandwidth of the laser is computed as $(\lambda_2 - \lambda_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction $\Delta\lambda\epsilon$ is subtracted, which provides sufficient accuracy. Therefore, the bandwidth is:

$$\Delta\lambda = \left(\frac{D_2 - D_1}{2}\right) - \Delta\lambda\epsilon$$

$\Delta\lambda\epsilon$ depends on both the etalon specifications and the true laser bandwidth. It typically lies in the range of 0.1–1 pm for the application described here.

Wavelength Calibration

About 10% of that portion of the beam that passes through mirror 182 are reflected from mirror 186 into fiber optic input 188 and the light travels through an optical fiber to atomic wavelength reference 190. The optical fiber connects to atomic reference unit 190 at opening 191, and the light from the optical fiber reflects off mirror 69 and is focused by lens 193 to a focal point in the center of neon iron vapor cell 194, and is focused again by lens 195 onto photodiode 196. Atomic wavelength reference unit 190 is used to calibrate wavemeter 120. This is done by adjusting the wavelength of the laser while keeping the output energy constant as shown by detector 69 while monitoring the output of photodiode 196. When photodiode 196 shows a substantial reduction in output while photodiode 69 shows nominal output, the wavelength of the output must correspond to the iron vapor absorption line of 248.3271 nm. The position data corresponding to the etalon fringes and the position data corresponding to the image produced by grating 176 on linear photodiode 180 when the output of photodiode 196 is lowest is detected and recorded by wavemeter controller 197 and this data are used by wavemeter controller 197 to calibrate wavemeter 120.

Microprocessor for Wavelength Measurement

Since there are only 500 microseconds between pulses of a 2000 Hz laser, wavelengths must be calculated in significantly less than 500 microseconds in order to have an opportunity to correct an upcoming pulse for the wavelength error of the immediately preceding pulse. As stated above, the photodiode array 180 can be read at the rate of $2\times10^6$ pixels/second. The data is read into a buffer memory so that processing of the data can begin during the readout. The processing of the data required to perform the above calculation is preferable done with a Model 68332 25 MHz microprocessor supplied by Motorola Corporation. Applicants have determined that this inexpensive processor can be over clocked to run at 43 MHz with no deterioration in performance. In one preferred arrangement all data is read out from PDA 180 and the wavelength calculations described above are made in a period of 420 microseconds allowing 80 microseconds to move mirror 14 prior the next burst.

Fast Mirror Adjustment

Figure 12:
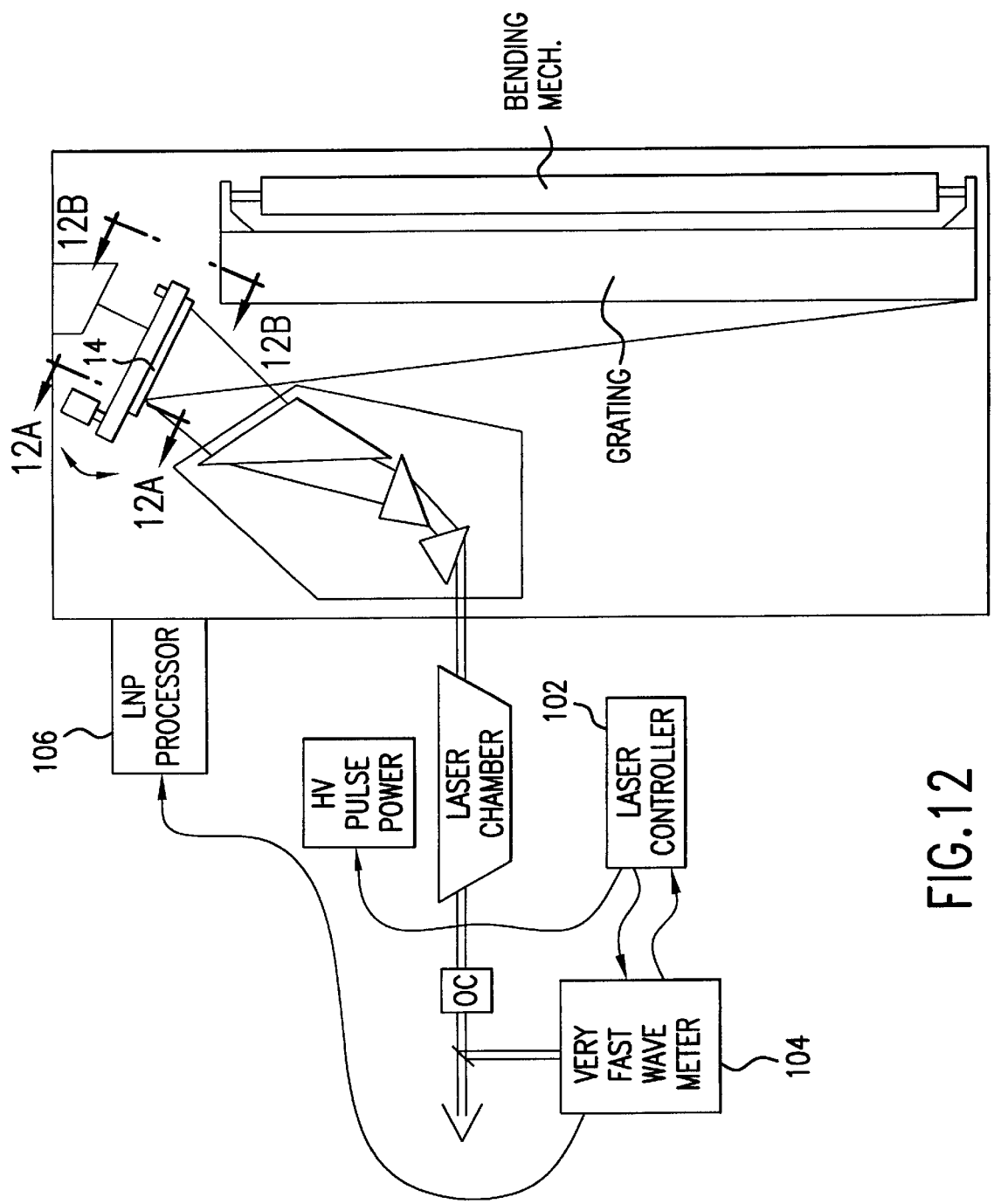
FIGS. 12, 12A and 12B show a proposed technique for providing fast and finer wavelength control.
Figure 12A:
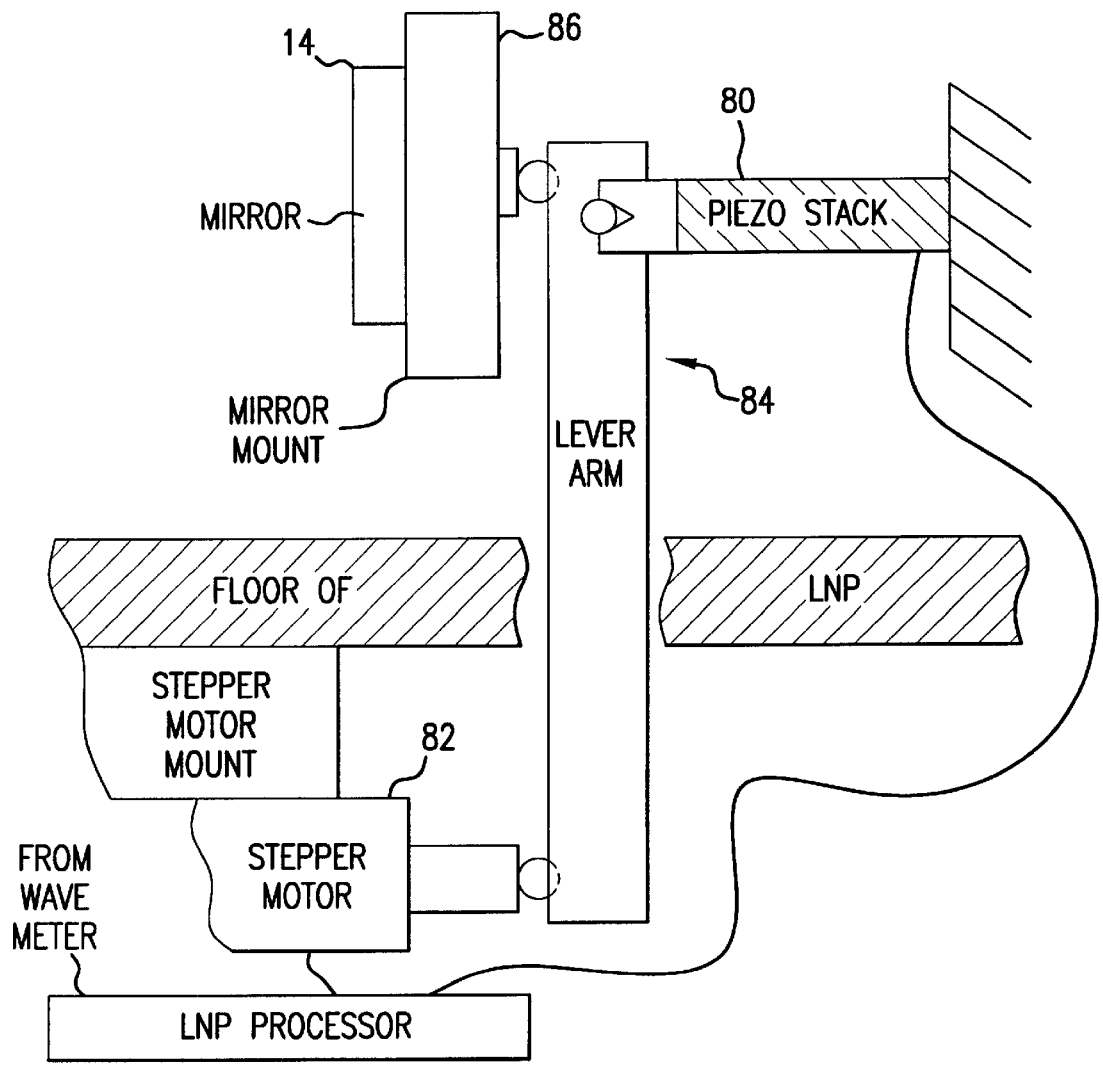
Figure 12B:
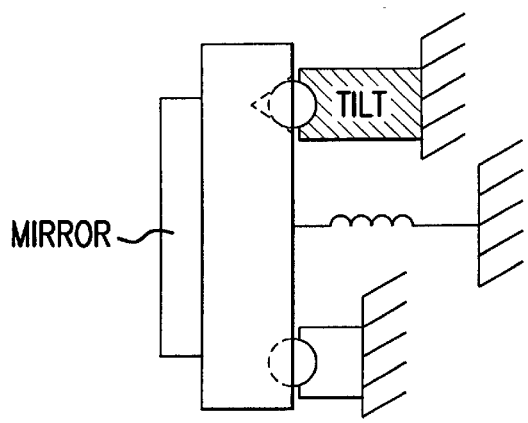
Figure 12C:
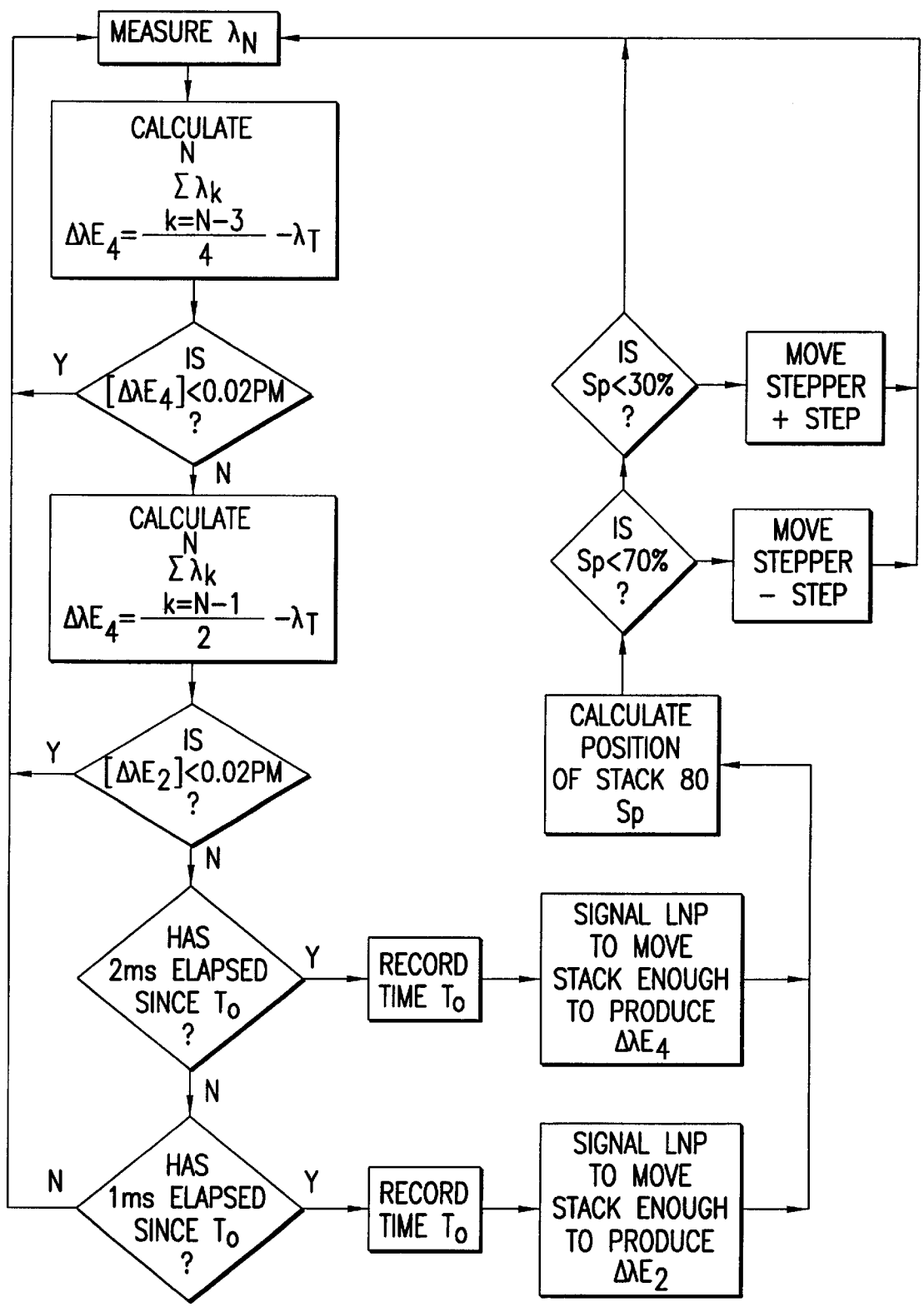
FIGS. 12C and 12D are flow charts describing wavelength control algorithms.

FIGS. 12, 12A and 12B show an arrangement permitting very fast adjustment of mirror 14. This embodiment is a major speed up as compared to the stepper motor drive system described above but not quite fast enough for pulse-to-pulse adjustment. As indicated above, earlier methods of mirror positioning required about 7 ms to move mirror 14, making pulse-to-pulse wavelength correction at 2000 Hz out of the question. In that earlier technique, a lever arm pivoted about a pivot axis to produce a 1 to 26.5 reduction in the mirror movement compared to the stepper position movement. The prior art stepper has a total travel of ½ inch (12.7 mm) and 6000 steps so that each step is a distance of about 2 microns. With the 1–26.5 reduction, one step moves the mirror about 75 nm which typically changes the wavelength of the laser wavelength about 0.1 pm. In the fast acting technique shown in FIG. 12A, a piezo stack 80 has been added at the pivot position of the lever arm. A preferred piezo stack is Model P-840.10 supplied by Physik Instrumente GmbH with offices in Waldbronn, Germany.

This stack will produce linear adjustment of about 3.0 microns with a drive voltage change of 20 volts. This range is equivalent to about ±20 steps of the stepper motor.

The stack responds to a control signal within less than 1 microsecond and the system can easily respond to updated signals at a frequency of 2000 Hz. In a preferred embodiment the control for each pulse at 2000 Hz pulse rate is based not on the previous pulse but the pulse prior to the previous pulse to allow plenty of time for the wavelength calculation. However, this embodiment provides a factor of 7 improvement over the prior art design with a 7 millisecond latency. Therefore, much faster feedback control can be provided. One preferred feedback control algorithm is described in FIG. 12C. In this algorithm the wavelength is measured for each pulse and an average wavelength for the last four and last two pulses is calculated. If either of the average deviate from the target wavelength by less than 0.02 pm, no adjustment is made. If both deviate more than 0.02 pm from the target, an adjustment is made to the mirror assembly by piezoelectric stack 80 to provide a wavelength correction. Which of the two averages is used is determined by how much time had elapsed since the last adjustment. The piezoelectric stack is maintained within its control range by stepping the stepper motor as the stack approaches 30 and 70 percent of its range (or to provide more available range, 45 and 55 percent could be used instead of the 30 and 70 percent range values). Since the stepper motor requires about 7 ms to complete a step, the algorithm may make several piezo adjustments during a stepper motor step.

Pulse-To-Pulse Feedback Control

Figure 13A:
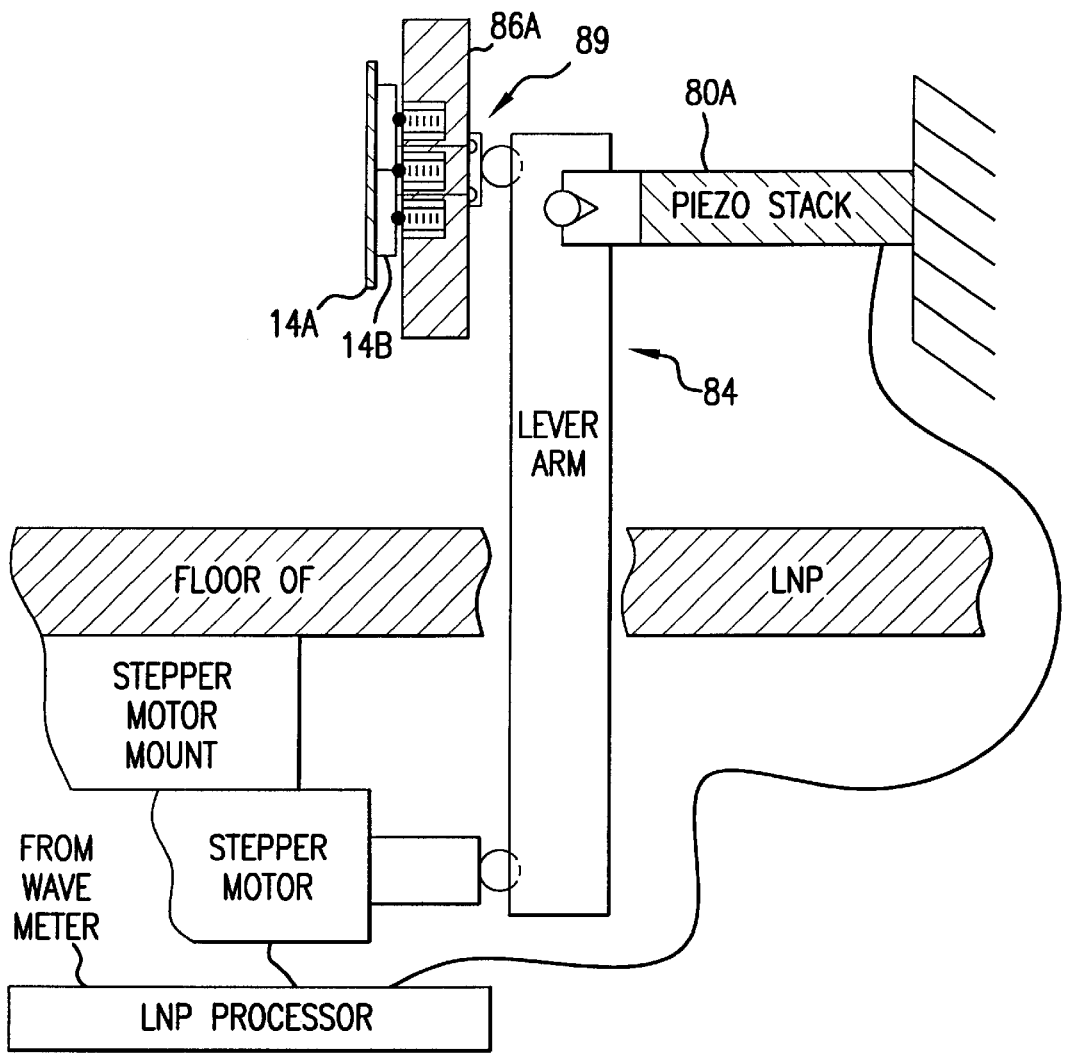
FIGS. 13A and 13B show a very fast mirror design.
Figure 13B:
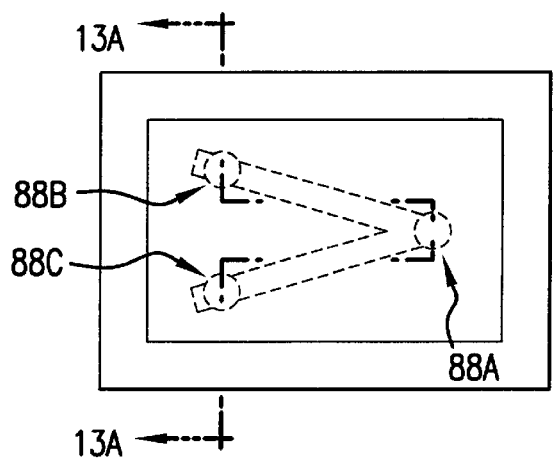

FIGS. 13A and 13B show a mirror control arrangement which permits adjustment of the mirror more quickly than 80 microseconds so that pulse-to-pulse correction is feasible at pulse repetition rates of 2000 Hz. In this case the piezoelectric stack 80 is replaced by a metal support 80A and instead piezoelectric adjustment is provided for a lightweight mirror 14A with bracing ribs 14B moving relative to the much heavier mirror mount 86A. Mirror 14A is held tightly against spherical contacts at the ends of stacks 88A, 88B and 88C by adjustable tension elements 89.

Figure 15A:
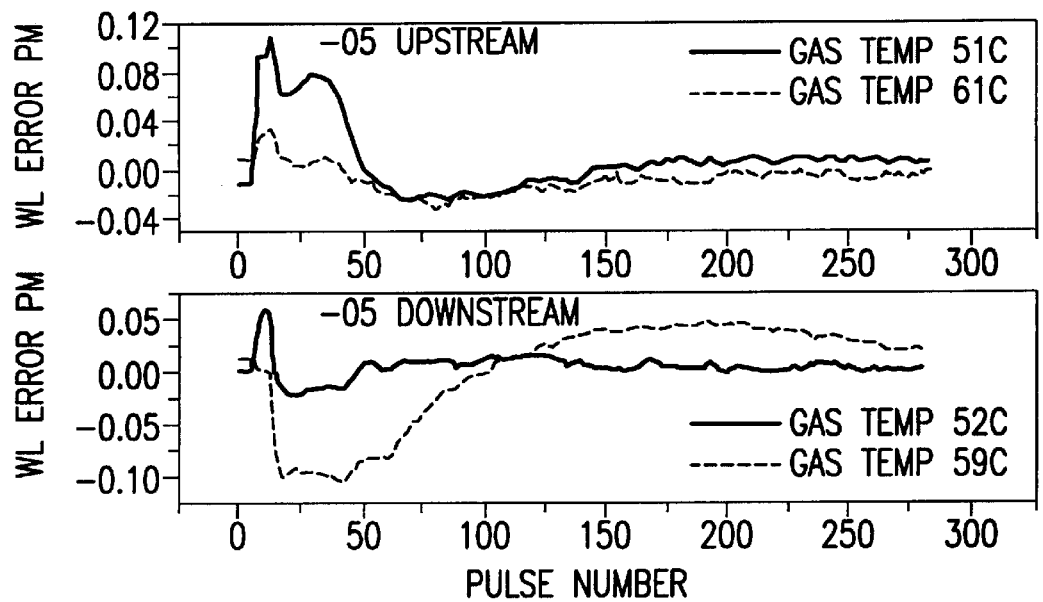
FIGS. 15A and 15B show test results.
Figure 15B:
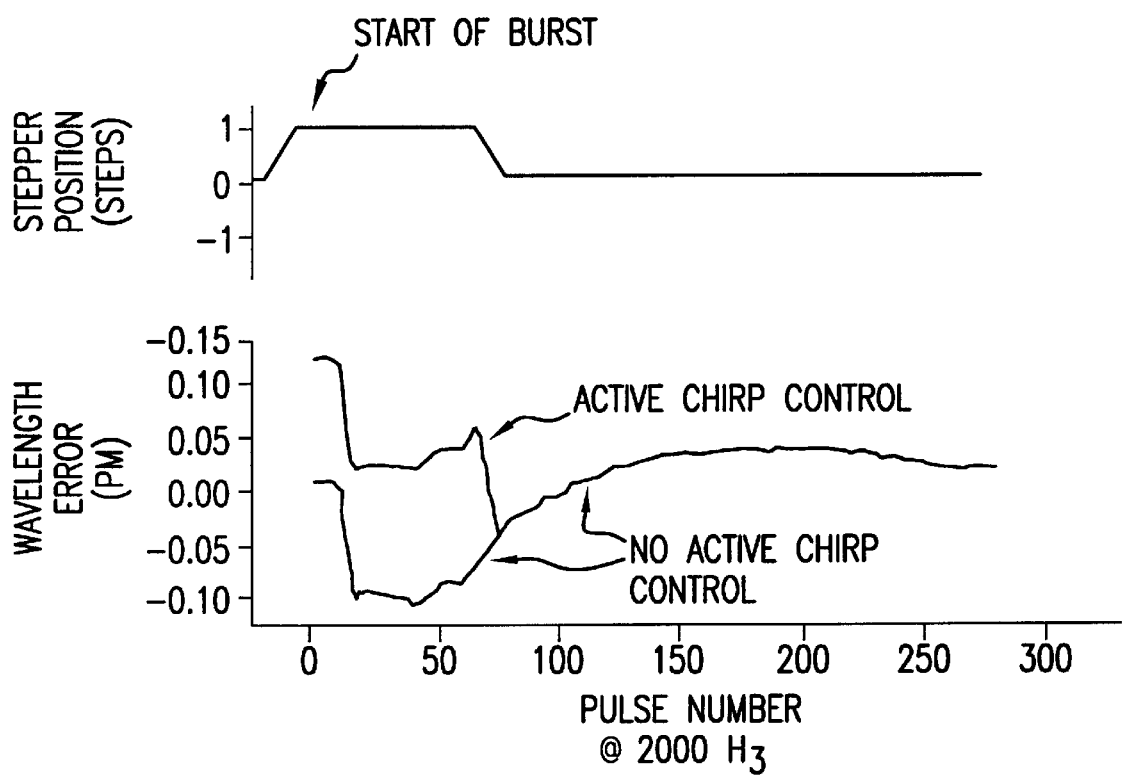
Figure 15C:
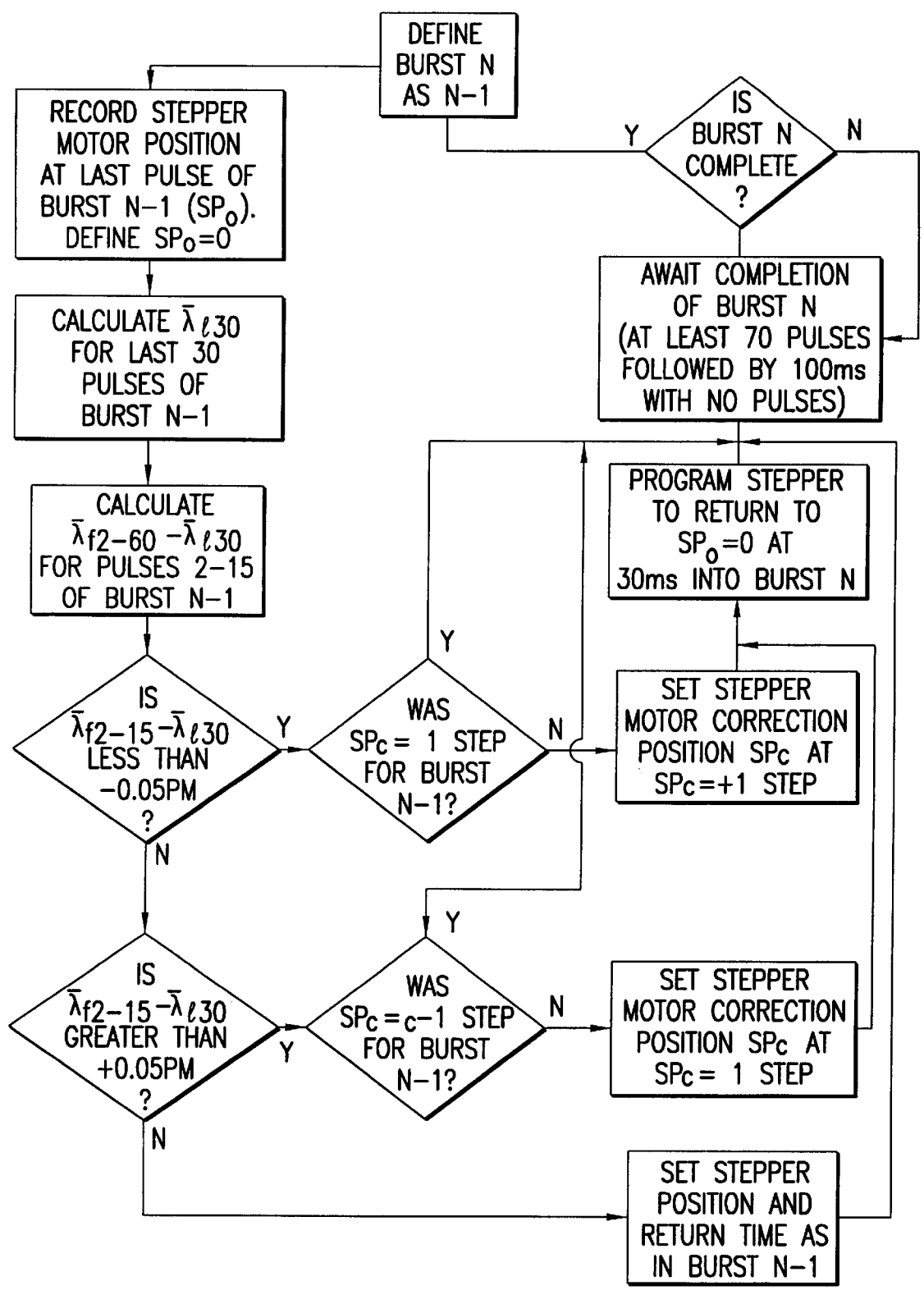
FIG. 15C shows a flow diagram of a preferred control technique.

In this embodiment these piezoelectric stacks provide very fine adjustment of the position of mirror 14A relative to mirror mount 86A. As in the above example, the total adjustment range of the piezoelectric elements 88A, 88B and 88C can be very small such as about 1.5 micron since large adjustments are provided by the stepper motor. Adjustment of this lightweight mirror with the three piezo elements over very small distances such as about 0.1 microns can be extremely fast in the range of about 10 microseconds. The mirror position can be adjusted by moving drive 88A in one direction and drives 88B and 88C in the opposite direction or by moving drive 88A only. As in the prior example, preferred control algorithms outlined in FIG. 12D calls for a stepper motor step if the piezo position reaches as low as about 30 or as high as 70 percent of the control range. This provides a control range without stepper motor movement of 160 nm which is equivalent to about 0.8 pm to about 1.6 pm (depending on whether one or three piezo drivers are used). Therefore, the very fast piezo controls have a range sufficient to control substantially all chirp variations which, as indicated in FIGS. 15A, are typically within the range of ±0.10 pm. Larger wavelength changes are provided by the stepper motor.

Figure 12D:
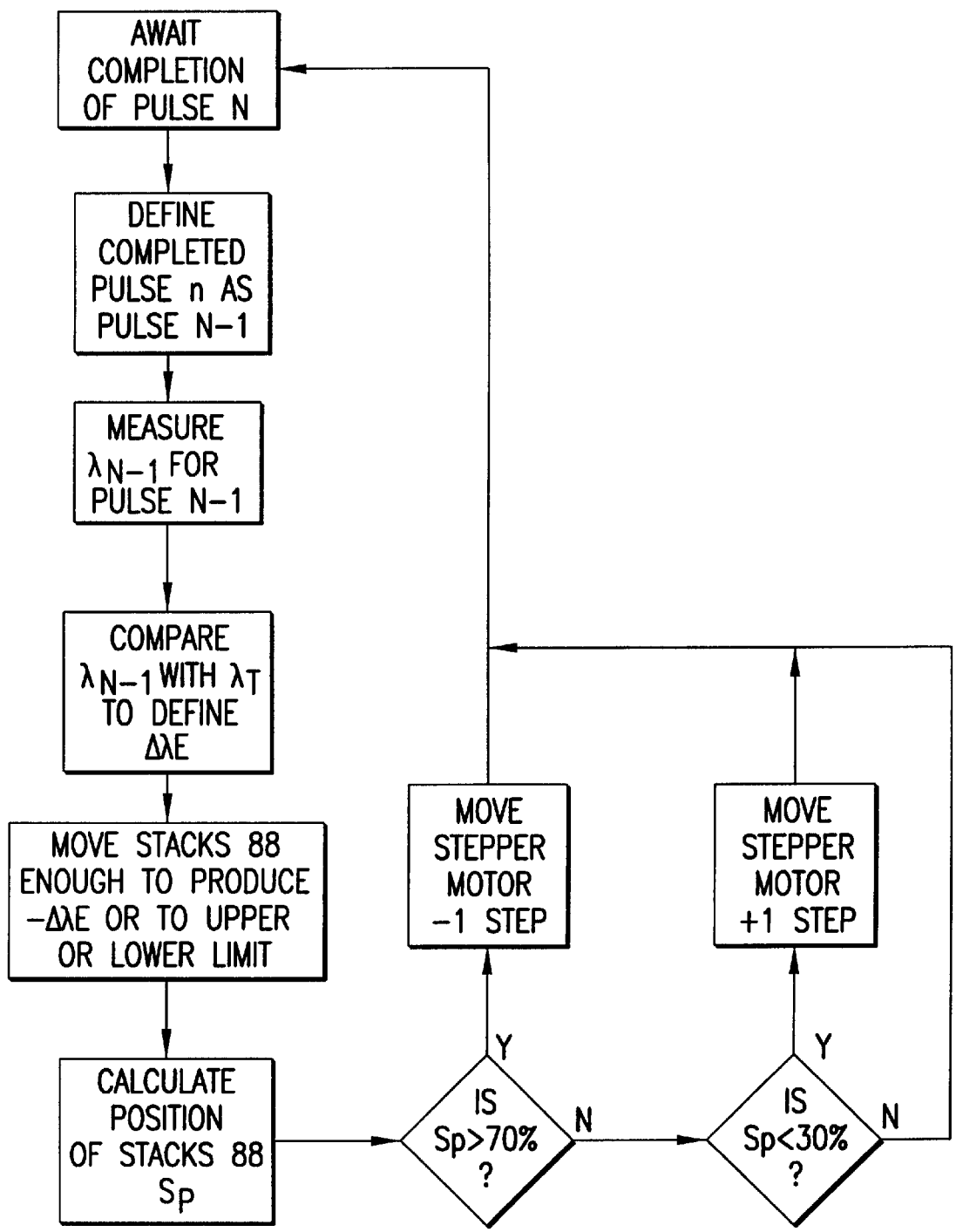

The algorithm outlined in FIG. 12D provides pulse-to-pulse control of the laser wavelength permitting next pulse correction using the very fast mirror design shown in FIGS. 13A and 13B. The algorithm as described in FIG. 12D awaits completion of a pulse N which it redefines as pulse N−1. It measures the wavelength of the pulse, compares it with a target pulse and moves stacks 88A, 88B and 88C or stack 88A to provide the desired wavelength correction. All of this is done prior to pulse N so that the mirror is moved and is stationary at the time of pulse N. If any of the stacks are outside of its 30% to 70% range, the stepper motor makes a step. The algorithm will then cause the out of range stack to move back within the 30% to 70% range. The position of the stacks are based on their control voltage. The algorithm could be modified so that no piezoelectric adjustment is made if the absolute value of $\Delta\lambda E$ is less than a specified small value such as 0.01 pm which is 20% of one specification value for wavelength variation.

Pretuning and Active Tuning

The embodiments described above can be used for purposes other than chirp corrections. In some cases the operator of a integrated circuit lithography machine may desire to change wavelength on a predetermined basis. In other words the target wavelength $\lambda_T$ may not be a fixed wavelength but could be changed as often as desired either following a predetermined pattern or as the result of a continuously or periodically updating learning algorithm using early historical wavelength data or other parameters.

Mirror Position Determination

Figure 14:
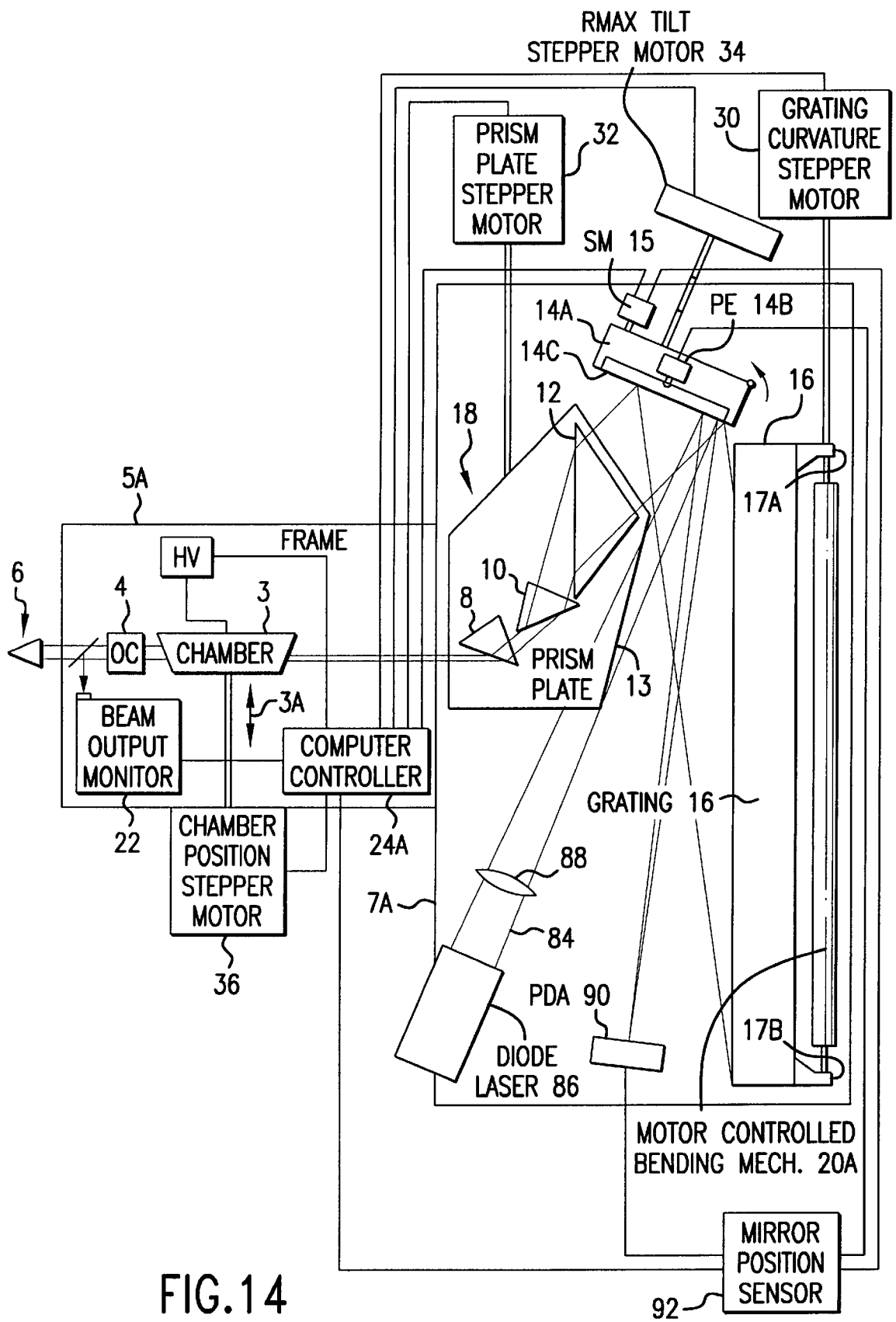
FIGS. 14, 14A and 14B show features of a preferred LNP.
Figure 14A:
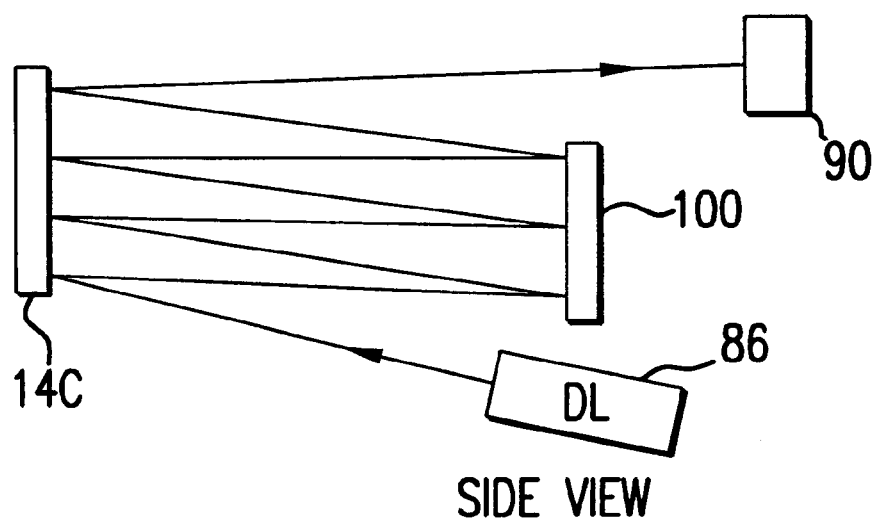
Figure 14B:
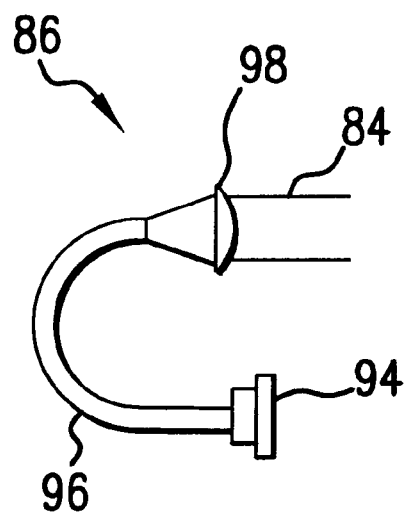

In some cases it may be desirable to control the wavelength by specifying particular mirror positions. This can be done with the embodiments shown in FIGS. 14 and 14A. In this embodiment a diode laser 86 provides as shown in FIG. 14B, a beam which is reflected off mirror 14C and the reflected beam is focused on a photodiode array 90 to determine the pivot position of mirror 14C. This arrangement permits precise positioning of the mirror without having to operate the laser for an actual wavelength measurement. This could be important when accurate prepositioning of the mirror is desired. FIG. 14A illustrates a technique of increasing the optical distance between mirror 14C and the PDA array to improve precision of the pivot measurement.

Detail Design with Piezoelectric Drive

Figure 7:
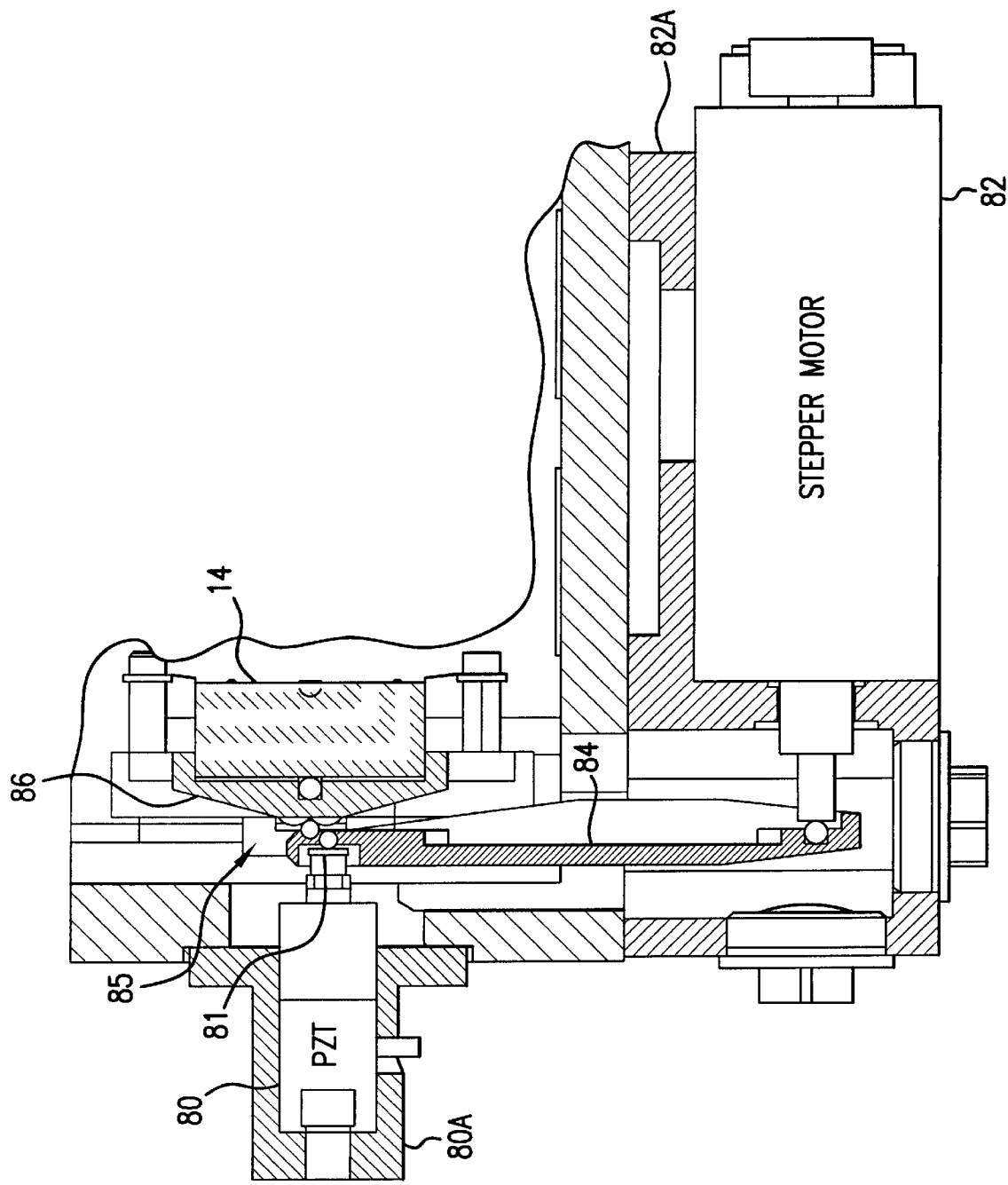
FIGS. 7 and 8 show two preferred embodiments built by Applicants.

FIG. 7 is a drawing showing detail features of a preferred embodiment of the present invention. This design is similar to the one shown in FIGS. 12A and 12B. Large changes in the position of mirror 14 are produced by stepper motor through a 26.5 to 1 lever arm 84. In this case a diamond pad 81 at the end of piezoelectric drive 80 is provided to contact spherical tooling ball at the fulcrum of lever arm 84. The contact between the top of lever arm 84 and mirror mount 86 is provided with a dow pin on the lever arm and four spherical ball bearings mounted (only two of which are shown) on the mirror mount as shown at 85. Piezoelectric drive 80 is mounted on the LNP frame with piezoelectric mount 80A and the stepper motor is mounted to the frame with stepper motor mount 82A. Mirror 14 is mounted in mirror mount 86 with a three point mount using three aluminum spheres, only one of which are shown in FIG. 7. Three springs 14A apply the compressive force to hold the mirror against the spheres.

Figure 8:
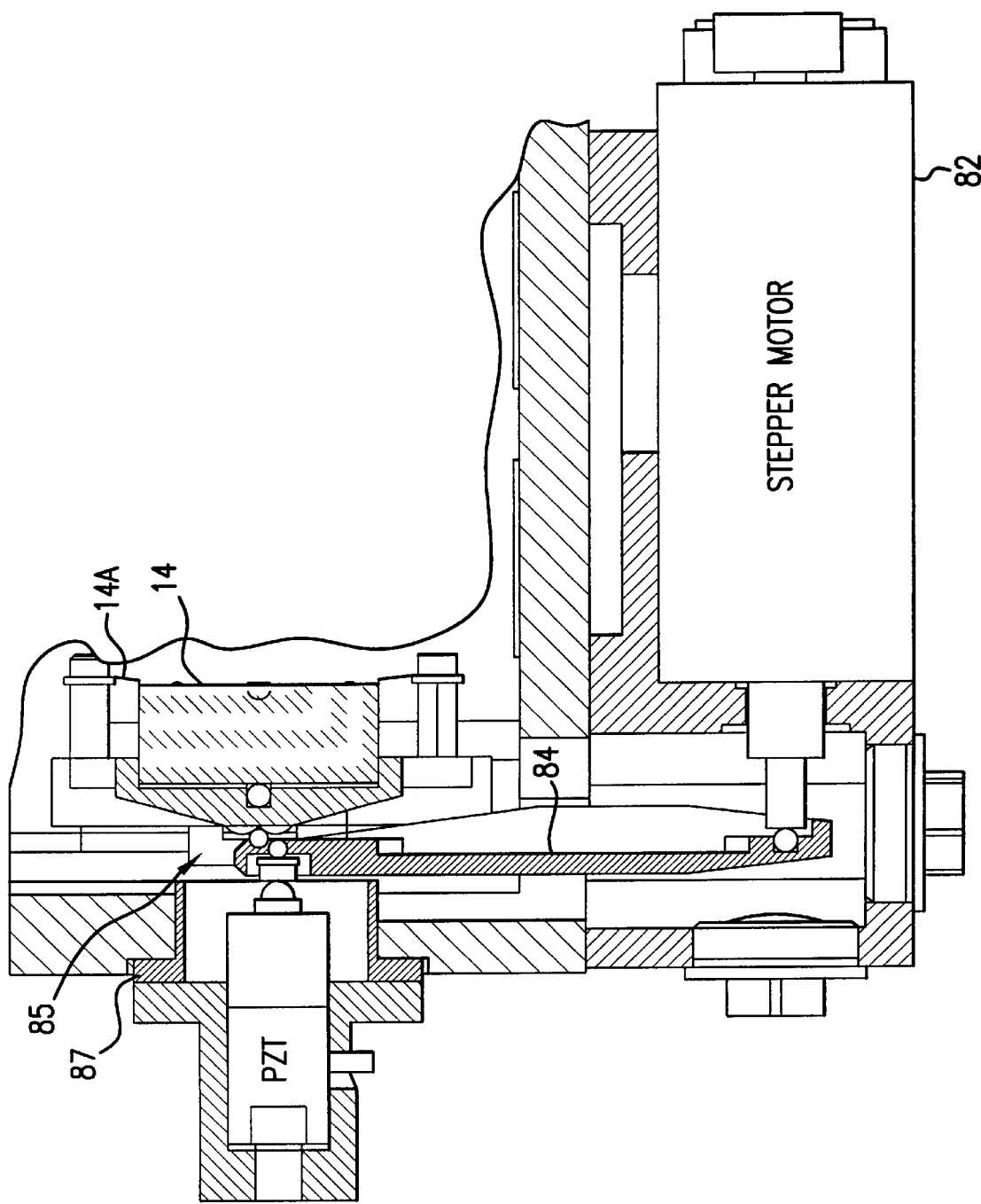

FIG. 8 is a preferred embodiment slightly different from the one shown in FIG. 7. This embodiment includes a bellows 87 to isolate the piezoelectric drive from the environment inside the LNP. This isolation prevents UV damage to the piezoelectric element and avoid possible contamination caused by out gassing from the piezoelectric materials.

Test Results

Figure 9:
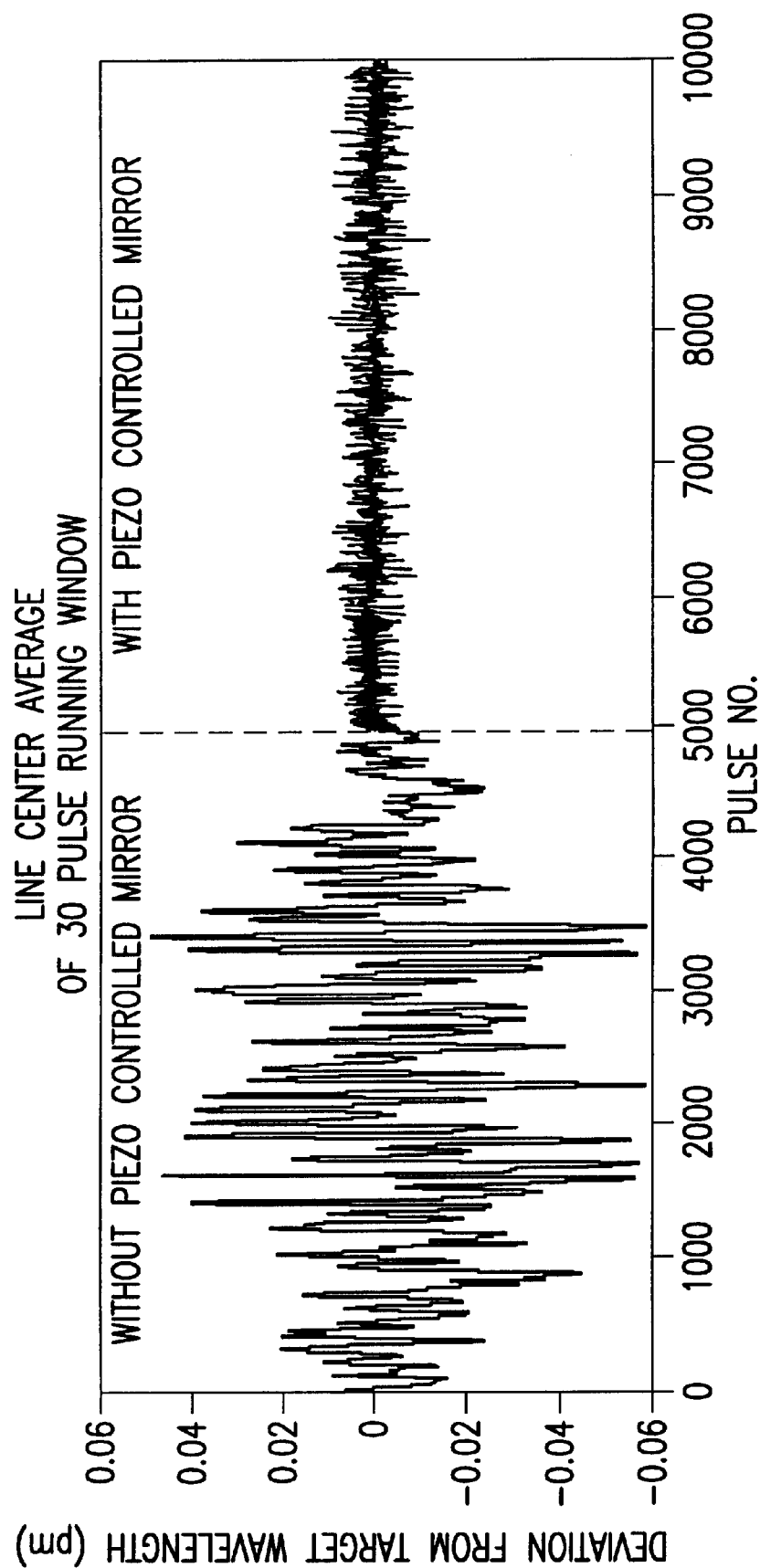
FIG. 9 shows test results.

FIG. 9 shows actual test data from a laser fitted with the FIG. 8 embodiment. The graph is a plot of the deviation from target wavelength of the average of 30 pulse windows. The deviation is reduced from about 0.05 pm to about 0.005 pm.

Deformable Tuning Mirror

Figure 10:
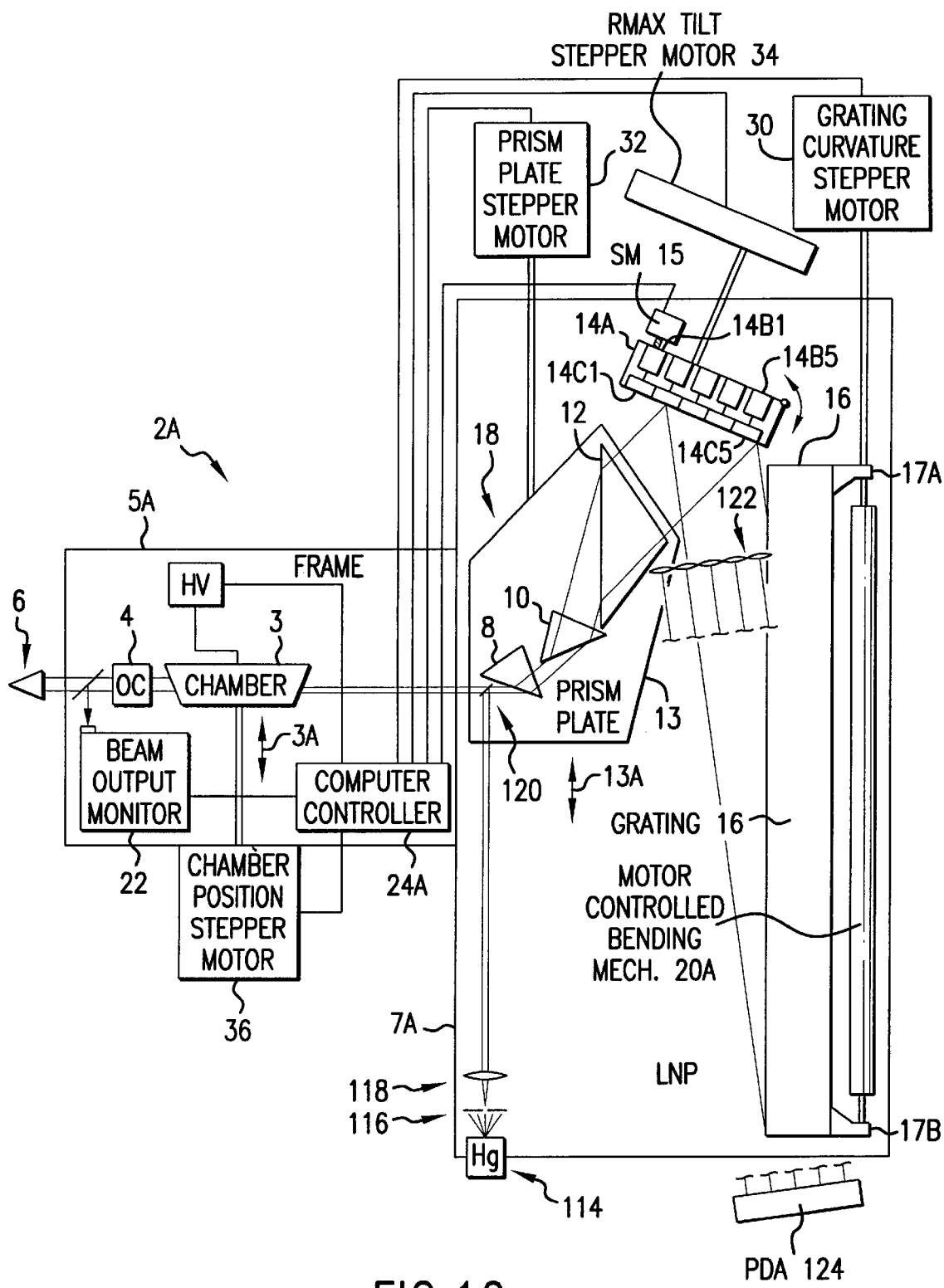
FIG. 10 shows a laser system configured in accordance with a preferred embodiment.

FIG. 10 illustrates the use of a segmented tuning mirror in which each of the 5 mirror segments is controlled by its own piezoelectric drive 14B1–5. Each of the segments can be operated very fast. This embodiment has an additional advantage of improving the bandwidth of the laser since each horizontal portion of the beam can be individually controlled. This embodiment also has a PDA 124 for determining the position of each segment. The light is provided by a mercury lamp 114 where the UV light is passed through a slit 116 and a columinating lens 118. The beam in this case is expanded through the same beam expander used to expand the laser beam and five small lenses focus light from each mirror on separate parts of the PDA.

Purging Grating Face

Figure 11A:
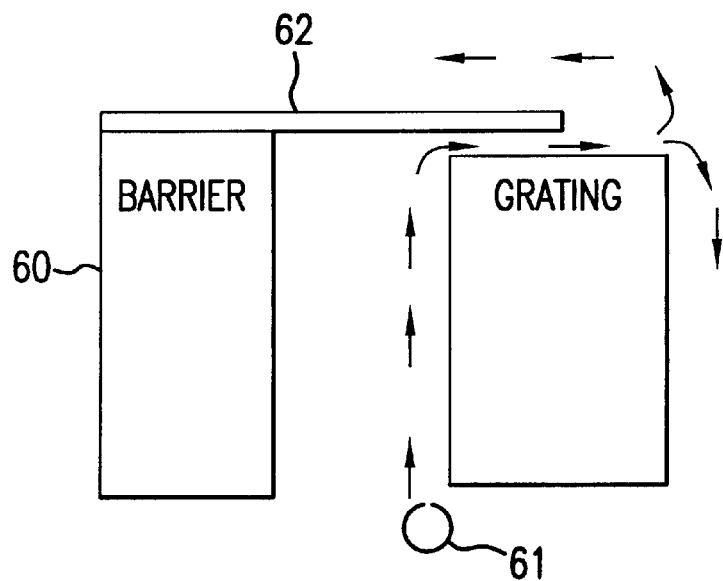
FIGS. 11A, 11B, 11C and 11D show techniques for cooling the face of a grating in a preferred embodiment.
Figure 11B:
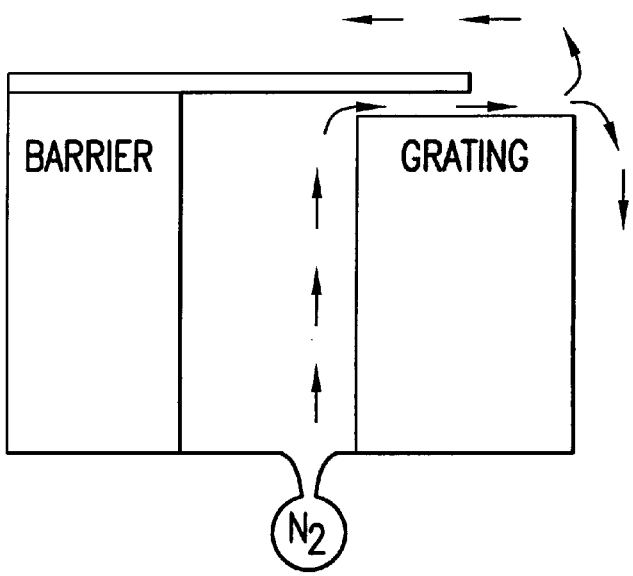
Figure 11C:
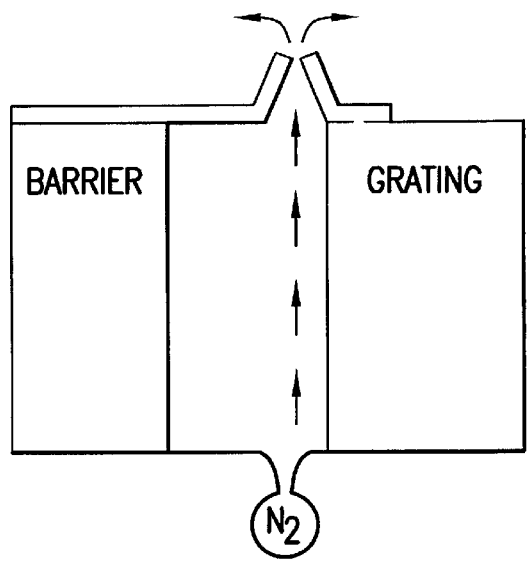
Figure 11D:
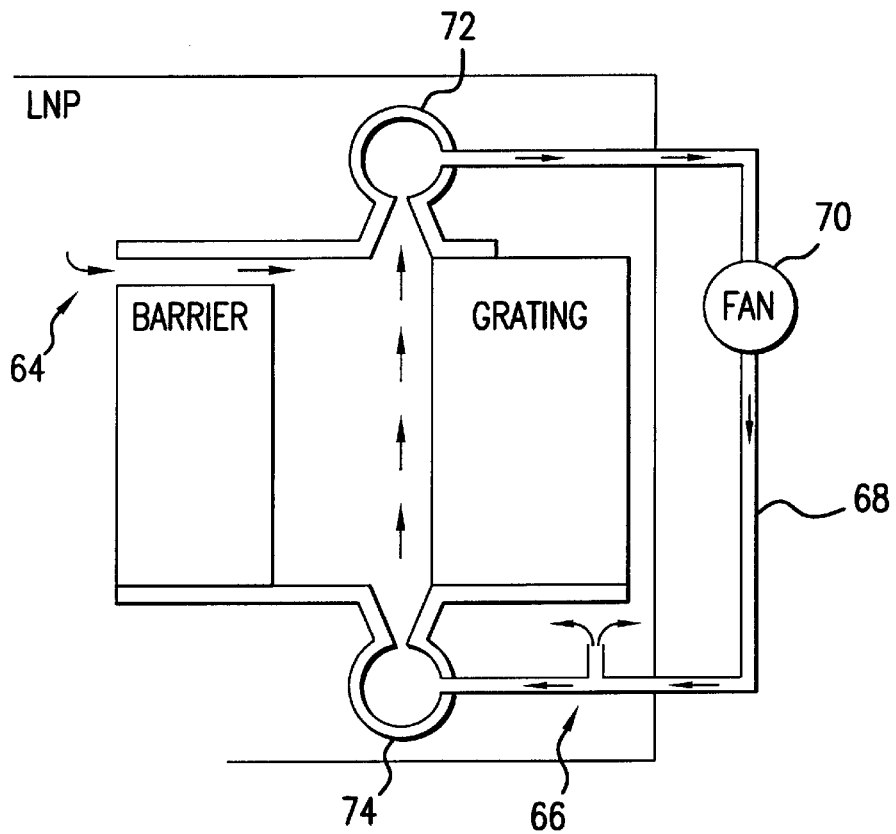

It is known to purge line narrowing packages; however, the prior art teaches keeping the purge flow from flowing directly on the grating face so that purge flow is typically provided through a port located at positions such as behind the face of the grating. Applicants have discovered, however, that at very high repetition rates a layer of hot gas (nitrogen) develops on the face of the grating distorting the wavelength. This distortion can be corrected at least in part by the active wavelength control discussed above. Another approach is to purge the face of the grating as shown in FIGS. 11A, 11B, 11C and 11D. In FIG. 11A, small holes (1 mm or ¼ inch spacings) in the top of 10-inch long ⅜ inch diameter purge tube 61 provides the purge flow. Other techniques are shown in FIGS. 11B, 11C and 11D.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. An electric discharge laser with active wavelength chirp mitigation comprising:
   A) a laser chamber,
   B) an elongated electrode structure enclosed within said chamber comprising an elongated anode and an elongated cathode separated by comprising an elongated anode and an elongated cathode separated by a distance defining a discharge region, said discharge region defining a long dimension in a beam direction, C) a laser gas contained in said chamber, D) a fan for circulating said laser gas within said chamber and through said discharge region, and E) an active chirp mitigation means, for mitigating wavelength chirp comprising:
   1) a fast wavelength detection means,
   2) a fast wavelength control means including a tuning mirror driven by a piezoelectric drive,
   3) a feedback circuit means providing feedback control having a response time of less than 10 millisecond, and
   4) a tuning mirror adjusting means for adjusting positions of said tuning mirror in advance of a burst of pulses said adjusting means comprising a processor programmed with a learning algorithm for learning shapes of chirps occurring early in a burst of pulses.

2. A laser as in claim 1 wherein said wavelength control means comprises a stepper motor.

3. A laser as in claim 1 wherein said active chirp mitigation means also comprises a stepper motor having an external spindle.

4. A laser as in claim 3 wherein said active chirp mitigation means also comprises a lever arm pivoted about a pivot axis to provide a de-magnification of linear movements of said external spindle.

5. A laser as in claim 1 wherein said active chirp mitigation means comprises a stepper motor for coarse wavelength control and a piezoelectric device for fine wavelength control.

6. An electric discharge laser with active wavelength chirp mitigation comprising:

A) a laser chamber,

B) an elongated electrode structure enclosed within said chamber comprising an elongated anode and an elongated cathode separated by a distance defining a discharge region, said discharge region defining a long dimension in a beam direction, C) a laser gas contained in said chamber, D) a fan for circulating said laser gas within said chamber and through said discharge region, E) a wavemeter for measuring centerline wavelength, F) a wavelength tuning mechanism including a tuning mirror and at least one piezoelectric drive for driving said tuning mirror, G) a feedback control system for controlling said tuning mechanism using measurement information from said wavemeter in order to actively control wavelength chirp, and H) an adjusting mechanism for adjusting position of the tuning mirror in advance of a burst of pulses to mitigate wavelength chirps occurring in early parts of the burst.

7. A laser as in claim 6 wherein the early occurring chirp has a duration of less than one millisecond.

8. A laser as in claim 6 wherein said adjusting mechanism comprises a stepper motor.

9. A laser as in claim 6 wherein said adjusting mechanism comprises a processor programmed with a learning algorithm for learning the shape of the early occupying chirps.

10. A laser as in claim 6 wherein said tuning mechanism also comprises a stepper motor having an external spindle.

11. A laser as in claim 10 wherein said tuning mechanism also comprises a lever arm pivoted about a pivot axis to provide a de-magnification of linear movements of said external spindle.

12. A laser as in claim 6 wherein said tuning mechanism comprises a stepper motor for coarse tuning and a piezoelectric device for fine tuning.

* * * * *

UNITED STATES PATENT AND TRADEMARK OFFICE
CERTIFICATE OF CORRECTION

PATENT NO. : 6,529,531 B1
DATED : March 4, 2003
INVENTOR(S) : George J. Everage et al.

Page 1 of 1

It is certified that error appears in the above-identified patent and that said Letters Patent is hereby corrected as shown below:

Column 12,
Lines 62-65, delete the words starting with "comprising an elongated anode and an elongated cathode separated by" and replace with -- B) an elongated electrode structure enclosed within said chamber comprising an elongated anode and an elongated cathode separated by a distance defining a discharge region, said discharge region defining a long dimension in a beam direction, --

Column 14,
Lines 23-25, should read -- A laser as in claim 6 wherein said adjusting mechanism comprises a processor programmed with a learning algorithm for learning the shape of the early occurring chirps. --

Signed and Sealed this

Twenty-seventh Day of July, 2004

JON W. DUDAS
*Acting Director of the United States Patent and Trademark Office*